(12) United States Patent
Radu et al.

(10) Patent No.: US 10,749,111 B2
(45) Date of Patent: *Aug. 18, 2020

(54) CROSSLINKABLE HOLE TRANSPORT MATERIALS

(71) Applicant: LG Chem, Ltd., Seoul (KR)

(72) Inventors: Nora Sabina Radu, Landenberg, PA (US); Adam Fennimore, Wilmington, DE (US); Gene M. Rossi, Wilmington, DE (US)

(73) Assignee: LG Chem, Ltd. (KR)

(*) Notice: Subject to any disclaimer, the term of this patent is extended or adjusted under 35 U.S.C. 154(b) by 48 days.

This patent is subject to a terminal disclaimer.

(21) Appl. No.: 15/763,991

(22) PCT Filed: Oct. 28, 2016

(86) PCT No.: PCT/US2016/059288
§ 371 (c)(1),
(2) Date: Mar. 28, 2018

(87) PCT Pub. No.: WO2017/079042
PCT Pub. Date: May 11, 2017

(65) Prior Publication Data
US 2018/0287067 A1 Oct. 4, 2018

Related U.S. Application Data

(63) Continuation of application No. 15/134,032, filed on Apr. 20, 2016, now Pat. No. 9,954,174.
(Continued)

(51) Int. Cl.
H01L 51/00 (2006.01)
C08G 61/12 (2006.01)
(Continued)

(52) U.S. Cl.
CPC .......... *H01L 51/0043* (2013.01); *C08G 61/12* (2013.01); *C08G 61/121* (2013.01);
(Continued)

(58) Field of Classification Search
CPC .......................... H01L 51/00; H01L 51/0043
(Continued)

(56) References Cited

U.S. PATENT DOCUMENTS 6,670,645 B2 12/2003 Grushin et al.
7,351,358 B2 4/2008 Hsu et al.
(Continued)

FOREIGN PATENT DOCUMENTS

JP H09310066 A 12/1997
JP 2009021335 A 1/2009
(Continued)

OTHER PUBLICATIONS

U.S. Appl. No. 15/134,032 claims (Year: 2017).*
(Continued)

*Primary Examiner* — Duc Truong
(74) *Attorney, Agent, or Firm* — Lerner, David, Littenberg, Krumholz & Mentlik, LLP

(57) ABSTRACT

There is disclosed a compound having Formula I

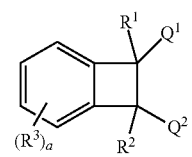

(I)

In Formula I: $R^1$ and $R^2$ are the same or different and are H or D;
(Continued)

$R^3$ is the same or different at each occurrence and D, CN, halogen, alkyl, alkoxy, silyl, germyl, deuterated alkyl, deuterated alkoxy, deuterated silyl, or deuterated germyl; a is an integer from 0-4; $Q^1$ and $Q^2$ are the same or different and are H, D, alkyl, deuterated alkyl, aryl, deuterated aryl, or a group having Formula II $$*\text{-}(L^1)_b\text{-HT} \tag{II}$$

At least one of $Q^1$ and $Q^2$ is a group having Formula II. In Formula II: HT is the same or different at each occurrence and is a hole transport group; $L^1$ is the same or different at each occurrence and is alkyl, aryl, substituted derivatives thereof, deuterated analogs thereof, or combinations thereof; b is the same or different at each occurrence and is 0 or 1; and * indicates a point of attachment.

3 Claims, 2 Drawing Sheets

Related U.S. Application Data

(60) Provisional application No. 62/251,405, filed on Nov. 5, 2015, provisional application No. 62/268,674, filed on Dec. 17, 2015.

(51) Int. Cl.
*C08G 73/02* (2006.01)
*H01L 51/50* (2006.01)

(52) U.S. Cl.
CPC ..... *C08G 73/026* (2013.01); *C08G 2261/124* (2013.01); *C08G 2261/132* (2013.01); *C08G 2261/135* (2013.01); *C08G 2261/148* (2013.01); *C08G 2261/1412* (2013.01); *C08G 2261/312* (2013.01); *C08G 2261/3162* (2013.01); *C08G 2261/411* (2013.01); *C08G 2261/512* (2013.01); *C08G 2261/95* (2013.01); *H01L 51/5056* (2013.01)

(58) Field of Classification Search
USPC ........................................................ 428/690
See application file for complete search history.

(56) References Cited

U.S. PATENT DOCUMENTS

| | | |
|---|---|---|
| 8,465,848 B2 | 6/2013 | Smith |
| 2002/0076576 A1 | 6/2002 | Li et al. |
| 2004/0102577 A1 | 5/2004 | Hsu et al. |
| 2004/0127637 A1 | 7/2004 | Hsu et al. |
| 2004/0158017 A1 | 8/2004 | O'Dell et al. |
| 2005/0184287 A1 | 8/2005 | Herron et al. |
| 2005/0205860 A1 | 9/2005 | Hsu et al. |
| 2011/0017983 A1 | 1/2011 | Mizuki et al. |
| 2012/0018715 A1 | 1/2012 | Moon et al. |
| 2012/0049167 A1 | 3/2012 | Kuramochi et al. |
| 2014/0193937 A1 | 7/2014 | Humphries et al. |
| 2014/0217379 A1 | 8/2014 | Humphries et al. |
| 2014/0235800 A1 | 8/2014 | Humphries et al. |
| 2014/0291651 A1 | 10/2014 | Humphries et al. |
| 2017/0170400 A1 | 6/2017 | Spencer et al. |
| 2017/0207393 A1 | 7/2017 | Pillow et al. |
| 2017/0207394 A1 | 7/2017 | Kamtekar et al. |
| 2017/0229656 A1 | 8/2017 | Zhu et al. |
| 2017/0244954 A1 | 8/2017 | Nagasaki et al. |
| 2018/0226584 A1 | 8/2018 | Spencer et al. |

FOREIGN PATENT DOCUMENTS

| | | |
|---|---|---|
| JP | 2014133740 A | 7/2014 |
| JP | 2014518311 A | 7/2014 |
| JP | 2017527650 A | 9/2017 |
| JP | 2017531047 A | 10/2017 |
| JP | 2017531308 A | 10/2017 |
| JP | 2017533575 A | 11/2017 |
| KR | 20090028943 A | 3/2009 |
| KR | 20100111767 A | 10/2010 |
| WO | 2003008424 A1 | 1/2003 |
| WO | 2003040257 A1 | 5/2003 |
| WO | 2003063555 A1 | 7/2003 |
| WO | 2003091688 A2 | 11/2003 |
| WO | 2004016710 A1 | 2/2004 |
| WO | 2005052027 A1 | 6/2005 |
| WO | 2007145979 A3 | 4/2008 |
| WO | 2009018009 A1 | 2/2009 |
| WO | 2011028216 A1 | 3/2011 |
| WO | 2011159872 A1 | 12/2011 |
| WO | 2013098113 A2 | 7/2013 |
| WO | 2014021571 A1 | 2/2014 |
| WO | 2015089304 A1 | 6/2015 |
| WO | 2016005749 A1 | 1/2016 |
| WO | 2016005750 A1 | 1/2016 |
| WO | 2016051981 A1 | 4/2016 |

OTHER PUBLICATIONS

Wang, Y., Kirk-Othmer Encyclopedia of Chemical Technology, Fourth Edition, 1996, vol. 18, pp. 837-860 (Book Not Included).
Podzimek, Z. "The Use of GPC Coupled with a Multiangle laser Light Scattering Photometer for the Characterization of Polymers. On the Determination of Molecular Weight, Size, and Branching," Journal of Applied Polymer Science, 1994, vol. 54, 91-103.
PCT International Search Report, Application No. PCT/US2016/059288; Kim Dong Seok, Authorized Officer, ISA/KR, ; dated Feb. 6, 2017.
PCT International Search Report for Application No. PCT/US2015/061309; Chang Bong Ho, Authorized Officer; ISA/KR; dated Mar. 2, 2016.
Hitosugi et al. "A Facile Chromatographic Method for Purification of Pinacol Boronic Esters," Chem. Lett. published Sep. 5, 2012, vol. 41, pp. 972-973.
Gustafsson, G. et al. "Flexible light-emitting diodes made from soluble conducting polymers," Letters to Nature, Jun. 11, 1992, vol. 357, pp. 477-479.
CRC Handbook of Chemistry and Physics, 81st Edition (2000-2001) (Book Not Included).
Agilent Technologies publication "A guide to multi-detector gel permeation chromatography," 2012, pp. 1-24, www.agilent.com/cs/library/primers/public/5990-7196EN.pdf.
Kessar SV, Nadir UK, Singh P, Gupta YP. Benzyne cyclisation with carbanion activated aromatic rings. Tetrahedron. Jan. 1, 1978;34(4):449-51.

* cited by examiner

CROSSLINKABLE HOLE TRANSPORT MATERIALS

This application is a 371 of PCT/US16/59288 filed Oct. 28, 2016 Which claims benefit of 62/251,405 filed Nov. 5, 2015 And claims benefit of 62/268,674 filed Dec. 17, 2015 And is a CON of Ser. No. 15/134,032 filed Apr. 20, 2016 now U.S. Pat. No. 9,954,174.

BACKGROUND INFORMATION

Field of the Disclosure

The present disclosure relates to novel hole transport compounds. The disclosure further relates to electronic devices having at least one layer comprising such an hole transport compound.

Description of the Related Art

In organic electronic devices, such as organic light emitting diodes ("OLED"), that make up OLED displays, one or more organic electroactive layers are sandwiched between two electrical contact layers. In an OLED at least one organic electroactive layer emits light through the light-transmitting electrical contact layer upon application of a voltage across the electrical contact layers.

It is well known to use organic electroluminescent compounds as the light-emitting component in light-emitting diodes. Simple organic molecules, conjugated polymers, and organometallic complexes have been used.

Devices that use electroluminescent materials frequently include one or more charge transport layers, which are positioned between a photoactive (e.g., light-emitting) layer and a contact layer (hole-injecting contact layer). A device can contain two or more contact layers. A hole transport layer can be positioned between the photoactive layer and the hole-injecting contact layer. The hole-injecting contact layer may also be called the anode. An electron transport layer can be positioned between the photoactive layer and the electron-injecting contact layer. The electron-injecting contact layer may also be called the cathode.

There is a continuing need for electroactive materials for use in electronic devices.

SUMMARY

There is provided a compound having Formula I

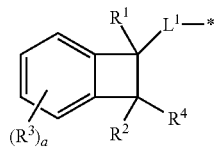

(I)

wherein $Q^1$ and $Q^2$ are the same or different and are selected from the group consisting of H, D, alkyl, deuterated alkyl, aryl, deuterated aryl, and a group having Formula II $$*\text{-}(L^1)_b\text{-HT} \quad (II)$$

with the proviso that at least one of $Q^1$ and $Q^2$ is a group having Formula II;

wherein:

HT is the same or different at each occurrence and is a hole transport group;

$L^1$ is the same or different at each occurrence and is selected from the group consisting of alkyl, aryl, substituted derivatives thereof, deuterated analogs thereof, and combinations thereof;

$R^1$ and $R^2$ are the same or different and are H or D;

$R^3$ is the same or different at each occurrence and is selected from the group consisting of D, CN, halogen, alkyl, alkoxy, silyl, germyl, deuterated alkyl, deuterated alkoxy, deuterated silyl, and deuterated germyl;

a is an integer from 0-4;

b is the same or different at each occurrence and is 0 or 1; and

* indicates a point of attachment.

There is also provided a polymer having at least one monomeric unit of Formula III

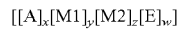

(III)

wherein:

$L^1$ is the same or different at each occurrence and is selected from the group consisting of alkyl, aryl, substituted derivatives thereof, deuterated analogs thereof, and combinations thereof;

$R^1$ and $R^2$ are the same or different and are H or D;

$R^3$ is the same or different at each occurrence and is selected from the group consisting of D, CN, halogen, alkyl, alkoxy, silyl, germyl, deuterated alkyl, deuterated alkoxy, deuterated silyl, and deuterated germyl;

$R^4$ is selected from the group consisting of H, D, and $L^1$;

a is an integer from 0-4; and

* indicates a point of attachment.

There is also provided a copolymer having Formula IV $$[[A]_x[M1]_y[M2]_z[E]_w] \quad (IV)$$

wherein:

A is a monomeric unit containing at least one hole transport group;

M1 is a monomeric unit having at least three points of attachment in the copolymer;

M2 is an aromatic monomeric unit having two points of attachment or a deuterated analog thereof;

E is a monomeric unit having Formula III-a

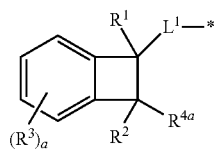

(III-a)

wherein:

$L^1$ is selected from the group consisting of alkyl, aryl, substituted derivatives thereof, deuterated analogs thereof, and combinations thereof;

$R^1$ and $R^2$ are the same or different and are H or D;

$R^3$ is the same or different at each occurrence and is selected from the group consisting of D, CN, halogen, alkyl, alkoxy, silyl, germyl, deuterated alkyl, deuterated alkoxy, deuterated silyl, and deuterated germyl;

$R^{4a}$ is H or D;

a is an integer from 0-4;

x, y, z and w are the same or different and are mole fractions, where at least x and w are non-zero; and

* indicates a point of attachment.

There is further provided an electronic device having at least one layer comprising a compound having Formula I, polymer having at least one monomeric unit having Formula III, or a copolymer having Formula IV.

The foregoing general description and the following detailed description are exemplary and explanatory only and are not restrictive of the invention, as defined in the appended claims.

BRIEF DESCRIPTION OF THE DRAWINGS

Embodiments are illustrated in the accompanying figures to improve understanding of concepts as presented herein.

Figure 1:
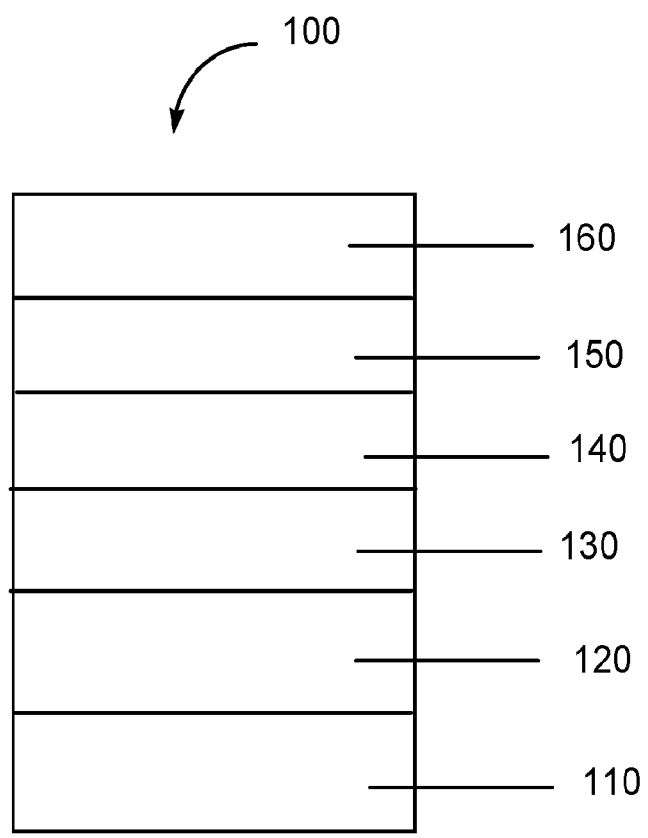
FIG. 1 includes an illustration of one example of an organic electronic device.

Skilled artisans appreciate that objects in the figures are illustrated for simplicity and clarity and have not necessarily been drawn to scale. For example, the dimensions of some of the objects in the figures may be exaggerated relative to other objects to help to improve understanding of embodiments.

DETAILED DESCRIPTION

There is provided a compound having Formula I, described in detail herein.

There is provided a polymer having at least one monomeric unit having Formula III, described in detail herein.

There is provided a copolymer having Formula IV, described in detail herein.

There is provided an electronic device having at least one layer comprising a compound having Formula I, polymer having at least one monomeric unit having Formula III, or a copolymer having Formula IV.

Many aspects and embodiments have been described above and are merely exemplary and not limiting. After reading this specification, skilled artisans appreciate that other aspects and embodiments are possible without departing from the scope of the invention.

Other features and benefits of any one or more of the embodiments will be apparent from the following detailed description, and from the claims. The detailed description first addresses Definitions and Clarification of Terms followed by the Compound, the Copolymer, the Electronic Device, and finally Examples.

1. Definitions and Clarification of Terms

Before addressing details of embodiments described below, some terms are defined or clarified.

As used herein, the term "alkyl" includes branched and straight-chain saturated aliphatic hydrocarbon groups. Unless otherwise indicated, the term is also intended to include cyclic groups. Examples of alkyl groups include methyl, ethyl, propyl, isopropyl, isobutyl, secbutyl, tertbutyl, pentyl, isopentyl, neopentyl, cyclopentyl, hexyl, cyclohexyl, isohexyl and the like. The term "alkyl" further includes both substituted and unsubstituted hydrocarbon groups. In some embodiments, the alkyl group may be mono-, di- and tri-substituted. One example of a substituted alkyl group is trifluoromethyl. Other substituted alkyl groups are formed from one or more of the substituents described herein. In certain embodiments alkyl groups have 1 to 20 carbon atoms. In other embodiments, the group has 1 to 6 carbon atoms. The term is intended to include heteroalkyl groups. Heteroalkyl groups may have from 1-20 carbon atoms.

The term "aromatic compound" is intended to mean an organic compound comprising at least one unsaturated cyclic group having delocalized pi electrons. The term is intended to encompass both aromatic compounds having only carbon and hydrogen atoms, and heteroaromatic compounds wherein one or more of the carbon atoms within the cyclic group has been replaced by another atom, such as nitrogen, oxygen, sulfur, or the like.

The term "aryl" or "aryl group" means a moiety derived from an aromatic compound. A group "derived from" a compound, indicates the radical formed by removal of one or more H or D. The aryl group may be a single ring (monocyclic) or multiple rings (bicyclic, or more) fused together or linked covalently. Examples of aryl moieties include, but are not limited to, phenyl, 1-naphthyl, 2-naphthyl, dihydronaphthyl, tetrahydronaphthyl, biphenyl, anthryl, phenanthryl, fluorenyl, indanyl, biphenylenyl, acenaphthenyl, acenaphthylenyl, and the like. In some embodiments, aryl groups have 6 to 60 ring carbon atoms; in some embodiments, 6 to 30 ring carbon atoms. The term is intended to include heteroaryl groups. Heteroaryl groups may have from 3-50 ring carbon atoms; in some embodiments, 4-30 ring carbon atoms.

The term "alkoxy" is intended to mean the group —OR, where R is alkyl.

The term "aryloxy" is intended to mean the group —OR, where R is aryl.

Unless otherwise indicated, all groups can be substituted or unsubstituted. An optionally substituted group, such as, but not limited to, alkyl or aryl, may be substituted with one or more substituents which may be the same or different. Suitable substituents include D, alkyl, aryl, nitro, cyano, —N(R$^7$)(R$^8$), halo, hydroxy, carboxy, alkenyl, alkynyl, cycloalkyl, heteroaryl, alkoxy, aryloxy, heteroaryloxy, alkoxycarbonyl, perfluoroalkyl, perfluoroalkoxy, arylalkyl, silyl, siloxane, thioalkoxy, —S(O)$_2$—N(R')(R''), —C(=O)—N(R')(R''), (R')(R'')N-alkyl, (R')(R'')N-alkoxyalkyl, (R')(R'')N-alkylaryloxyalkyl, —S(O)$_s$-aryl (where s=0-2) or —S(O)$_s$-heteroaryl (where s=0-2). Each R' and R'' is independently an optionally substituted alkyl, cycloalkyl, or aryl group. R' and R'', together with the nitrogen atom to which they are bound, can form a ring system in certain embodiments. Substituents may also be crosslinking groups.

The term "charge transport," when referring to a layer, material, member, or structure is intended to mean such layer, material, member, or structure facilitates migration of such charge through the thickness of such layer, material, member, or structure with relative efficiency and small loss of charge. Hole transport materials facilitate positive charge; electron transport materials facilitate negative charge. Although light-emitting materials may also have some charge transport properties, the term "charge transport layer, material, member, or structure" is not intended to include a layer, material, member, or structure whose primary function is light emission.

The term "compound" is intended to mean an electrically uncharged substance made up of molecules that further include atoms, wherein the atoms cannot be separated from their corresponding molecules by physical means without breaking chemical bonds. The term is intended to include oligomers and polymers.

The term "crosslinkable group" or "crosslinking group" is intended to mean a group on a compound or polymer chain than can link to another compound or polymer chain via thermal treatment, use of an initiator, or exposure to radiation, where the link is a covalent bond. In some embodiments, the radiation is UV or visible. Examples of crosslinkable groups include, but are not limited to vinyl, acrylate, perfluorovinylether, 1-benzo-3,4-cyclobutane, o-quinodimethane groups, siloxane, cyanate groups, cyclic ethers (epoxides), cycloalkenes, and acetylenic groups.

The term "electroactive" as it refers to a layer or a material, is intended to indicate a layer or material which electronically facilitates the operation of the device. Examples of electroactive materials include, but are not limited to, materials which conduct, inject, transport, or block a charge, where the charge can be either an electron or a hole, or materials which emit radiation or exhibit a change in concentration of electron-hole pairs when receiving radiation. Examples of inactive materials include, but are not limited to, planarization materials, insulating materials, and environmental barrier materials.

The prefix "fluoro" is intended to indicate that one or more hydrogens in a group has been replaced with fluorine.

The prefix "hetero" indicates that one or more carbon atoms has been replaced with a different atom. In some embodiments, the heteroatom is O, N, S, or combinations thereof.

The term "liquid composition" is intended to mean a liquid medium in which a material is dissolved to form a solution, a liquid medium in which a material is dispersed to form a dispersion, or a liquid medium in which a material is suspended to form a suspension or an emulsion.

The term "photoactive" refers to a material or layer that emits light when activated by an applied voltage (such as in a light emitting diode or chemical cell), that emits light after the absorption of photons (such as in down-converting phosphor devices), or that responds to radiant energy and generates a signal with or without an applied bias voltage (such as in a photodetector or a photovoltaic cell).

The term "silyl" refers to the group $R_3Si—$, where R is H, D, C1-20 alkyl, fluoroalkyl, or aryl. In some embodiments, one or more carbons in an R alkyl group are replaced with Si. In some embodiments, the silyl groups are $(hexyl)_2Si(Me)CH_2CH_2Si(Me)_2$- and $[CF_3(CF_2)_6CH_2CH_2]_2SiMe$-.

The term "siloxane" refers to the group $(RO)_3Si—$, where R is H, D, C1-20 alkyl, or fluoroalkyl.

The phrase "adjacent to," when used to refer to layers in a device, does not necessarily mean that one layer is immediately next to another layer. On the other hand, the phrase "adjacent R groups," is used to refer to R groups that are next to each other in a chemical formula (i.e., R groups that are on atoms joined by a bond).

In this specification, unless explicitly stated otherwise or indicated to the contrary by the context of usage, where an embodiment of the subject matter hereof is stated or described as comprising, including, containing, having, being composed of or being constituted by or of certain features or elements, one or more features or elements in addition to those explicitly stated or described may be present in the embodiment. An alternative embodiment of the disclosed subject matter hereof, is described as consisting essentially of certain features or elements, in which embodiment features or elements that would materially alter the principle of operation or the distinguishing characteristics of the embodiment are not present therein. A further alternative embodiment of the described subject matter hereof is described as consisting of certain features or elements, in which embodiment, or in insubstantial variations thereof, only the features or elements specifically stated or described are present.

Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of "a" or "an" are employed to describe elements and components described herein. This is done merely for convenience and to give a general sense of the scope of the invention. This description should be read to include one or at least one and the singular also includes the plural unless it is obvious that it is meant otherwise.

Group numbers corresponding to columns within the Periodic Table of the elements use the "New Notation" convention as seen in the *CRC Handbook of Chemistry and Physics,* 81$^{st}$ Edition (2000-2001).

Unless otherwise defined, all technical and scientific terms used herein have the same meaning as commonly understood by one of ordinary skill in the art to which this invention belongs. Although methods and materials similar or equivalent to those described herein can be used in the practice or testing of embodiments of the present invention, suitable methods and materials are described below. All publications, patent applications, patents, and other references mentioned herein are incorporated by reference in their entirety, unless a particular passage is cited. In case of conflict, the present specification, including definitions, will control. In addition, the materials, methods, and examples are illustrative only and not intended to be limiting.

To the extent not described herein, many details regarding specific materials, processing acts, and circuits are conventional and may be found in textbooks and other sources within the organic light-emitting diode display, photodetector, photovoltaic, and semiconductive member arts.

2. Compound

The compound described herein has Formula I

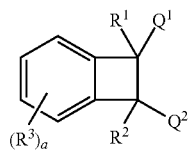

(I)

wherein $Q^1$ and $Q^2$ are the same or different and are selected from the group consisting of H, D, alkyl, deuterated alkyl, aryl, deuterated aryl, and a group having Formula II

*-(L$^1$)$_b$-HT    (II)

with the proviso that at least one of $Q^1$ and $Q^2$ is a group having Formula II;
wherein:
  HT is the same or different at each occurrence and is a hole transport group;
  $L^1$ is the same or different at each occurrence and is selected from the group consisting of alkyl, aryl, substituted derivatives thereof, deuterated analogs thereof, and combinations thereof;

$R^1$ and $R^2$ are the same or different and are H or D;

$R^3$ is the same or different at each occurrence and is selected from the group consisting of D, CN, halogen, alkyl, alkoxy, silyl, germyl, deuterated alkyl, deuterated alkoxy, deuterated silyl, and deuterated germyl;

a is an integer from 0-4;

b is the same or different at each occurrence and is 0 or 1; and

* indicates a point of attachment.

In some embodiments, the compound having Formula I is deuterated. The term "deuterated" is intended to mean that at least one hydrogen ("H") has been replaced by deuterium ("D"). The term "deuterated analog" refers to a structural analog of a compound or group in which one or more available hydrogens have been replaced with deuterium. In a deuterated compound or deuterated analog, the deuterium is present in at least 100 times the natural abundance level. In some embodiments, the compound is at least 10% deuterated. By "% deuterated" or "% deuteration" is meant the ratio of deuterons to the sum of protons plus deuterons, expressed as a percentage. In some embodiments, the compound is at least 10% deuterated; in some embodiments, at least 20% deuterated; in some embodiments, at least 30% deuterated; in some embodiments, at least 40% deuterated; in some embodiments, at least 50% deuterated; in some embodiments, at least 60% deuterated; in some embodiments, at least 70% deuterated; in some embodiments, at least 80% deuterated; in some embodiments, at least 90% deuterated; in some embodiments, 100% deuterated.

Deuterated materials can be less susceptible to degradation by holes, electrons, excitons, or a combination thereof. Deuteration can potentially inhibit degradation of the compound during device operation, which in turn can lead to improved device lifetime. In general, this improvement is accomplished without sacrificing other device properties. Furthermore, the deuterated compounds frequently have greater air tolerance than the non-deuterated analogs. This can result in greater processing tolerance both for the preparation and purification of the materials and in the formation of electronic devices using the materials.

In some embodiments of Formula I, $=Q^2$.

In some embodiments of Formula I, $Q^1 \neq Q^2$.

In some embodiments of Formula I, $Q^1$ is H or D.

In some embodiments of Formula I, $Q^1$ is an alkyl or deuterated alkyl group having 1-12 carbons; in some embodiments, 1-8 carbons; in some embodiments, 3-8 carbons.

In some embodiments of Formula I, $Q^1$ is a hydrocarbon aryl or deuterated analog having 6-60 ring carbons; in some embodiments 6-30 ring carbons; in some embodiments, 10-20 ring carbons.

In some embodiments of Formula I, $Q^1$ is a hydrocarbon aryl group having at least one fused ring or deuterated analog thereof.

In some embodiments of Formula I, $Q^1$ is selected from the group consisting of naphthyl, anthracenyl, naphthylphenyl, phenylnaphthyl, fluorenyl, substituted derivatives thereof, and deuterated analogs thereof.

In some embodiments of Formula I, $Q^1$ is a hydrocarbon aryl group having no fused rings.

In some embodiments of Formula I, $Q^1$ has Formula a

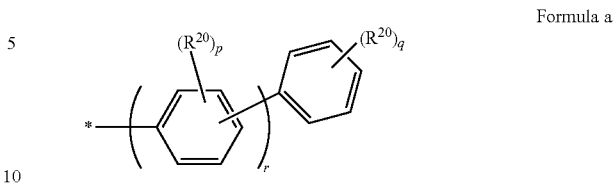

Formula a where:

$R^{20}$ is the same or different at each occurrence and is selected from the group consisting of D, alkyl, alkoxy, siloxane, silyl, germyl, and deuterated analogs thereof;

p is the same or different at each occurrence and is an integer from 0-4;

q is an integer from 0-5;

r is an integer from 1 to 5; and

* represents a point of attachment.

In some embodiments of Formula I, $Q^1$ has Formula b

Formula b where $R^{20}$, p, q, r and * are as in Formula a.

In some embodiments of Formula I, $Q^1$ is selected from the group consisting of phenyl, biphenyl, terphenyl, naphthyl, phenylnaphthyl, naphthylphenyl, substituted derivatives thereof, and deuterated analogs thereof. In some embodiments, the substituents are selected from the group consisting of D, F, CN, alkyl, silyl, germyl, deuterated alkyl, deuterated silyl, and deuterated germyl.

In some embodiments of Formula I, $Q^1$ is a heteroaryl having 3-60 ring carbons or deuterated analog thereof. In some embodiments, the heteroaryl has 3-30 ring carbons; in some embodiments, 5-20 ring carbons.

In some embodiments of Formula I, $Q^1$ is an N-heteroaryl or deuterated analog thereof.

In some embodiments, the N-heteroaryl is a group derived from a compound selected from the group consisting of pyrrole, pyridine, pyrimidine, carbazole, imidazole, benzimidazole, imidazolobenzimidazole, triazole, benzotriazole, triazolopyridine, indolocarbazole, phenanthroline, quinoline, isoquinoline, quinoxaline, indole, indoloindole, substituted derivatives thereof, and deuterated analogs thereof.

In some embodiments of Formula I, $Q^1$ is a group having Formula II, as defined above.

In some embodiments of Formula II, b=0.

In some embodiments of Formula II, b=1.

In some embodiments of Formula II, b=1 and $L^1$ is an alkyl or deuterated alkyl group having 1-12 carbons; in some embodiments, 1-8 carbons; in some embodiments, 3-8 carbons.

In some embodiments of Formula II, b=1 and $L^1$ is a hydrocarbon aryl or deuterated analog having 6-60 ring carbons; in some embodiments 6-30 ring carbons; in some embodiments, 10-20 ring carbons.

In some embodiments of Formula II, b=1 and $L^1$ is a hydrocarbon aryl group having at least one fused ring or deuterated analog thereof.

In some embodiments of Formula II, b=1 and $L^1$ is selected from the group consisting of naphthyl, anthracenyl, naphthylphenyl, phenylnaphthyl, fluorenyl, substituted derivatives thereof, and deuterated analogs thereof.

In some embodiments of Formula II, b=1 and $L^1$ is a hydrocarbon aryl group having no fused rings.

In some embodiments of Formula II, b=1 and $L^1$ has Formula c,

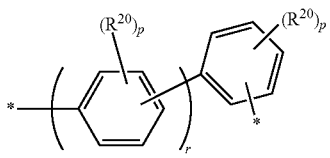

where $R^{20}$, p, r and * are as in Formula a.

In some embodiments of Formula II, b=1 and $L^1$ has Formula d

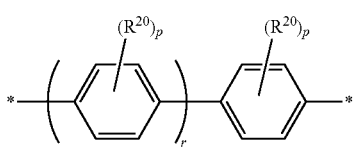

where $R^{20}$, p, r and * are as in Formula a.

In some embodiments of Formula II, b=1 and $L^1$ is selected from the group consisting of phenyl, biphenyl, terphenyl, naphthyl, phenylnaphthyl, naphthylphenyl, substituted derivatives thereof, and deuterated analogs thereof. In some embodiments, the substituents are selected from the group consisting of D, F, CN, alkyl, silyl, germyl, deuterated alkyl, deuterated silyl, and deuterated germyl.

In some embodiments of Formula II, b=1 and $L^1$ is a heteroaryl having 3-60 ring carbons or deuterated analog thereof. In some embodiments, the heteroaryl has 3-30 ring carbons; in some embodiments, 5-20 ring carbons.

In some embodiments of Formula II, b=1 and $L^1$ is an N-heteroaryl or deuterated analog thereof.

In some embodiments of Formula II, HT comprises a moiety selected from the group consisting of arylamino, N-heterocyclic, fused hydrocarbon aromatic, substituted derivatives thereof, combinations thereof, and deuterated analogs thereof.

In some embodiments of Formula II, HT is selected from the group consisting of diarylamino, triarylamino, substituted derivatives thereof, and deuterated analogs thereof. In some embodiments, HT is a moiety comprising at least two arylamino groups.

In some embodiments of Formula II, HT is an N-heterocyclic group having one or more nitrogen heteroatoms and no other heteroatoms, or a deuterated analog thereof.

In some embodiments, the N-heterocyclic group having only nitrogen heteroatom(s) is derived from a compound selected from the group consisting of carbazole, benzocarbazole, azacarbazole, acridan, indole, indoloindole, indolocarbazole, imidazole, benzimidazole, pyrrolopyrrole, diazine, pyridine, pyrimidine, pyridazine, pyrazine, triazine, triazolopyridine, quinoline, isoquinoline, substituted derivatives thereof, and deuterated analogs thereof.

In some embodiments of Formula II, HT is an N-heterocyclic group having at least one nitrogen heteroatom and at least one oxygen or sulfur heteroatom.

In some embodiments, the N-heterocyclic group is derived from a compound selected from the group consisting of oxazine, phenoxazine, oxazole, benzoxazole, phenothiazine, benzothiazole, benzothiadiazole, substituted derivatives thereof, and deuterated analogs thereof.

In some embodiments of Formula II, HT is a hydrocarbon aryl group having fused rings or a deuterated analog thereof.

In some embodiments, the hydrocarbon aryl group is derived from a compound selected from the group consisting of fluorene, anthracene, benzanthracene, triphenylene, indane, indenofluorene, substituted derivatives thereof, and deuterated analogs thereof.

In some embodiments of Formula II, HT comprises at least one arylamino group and a second group derived from a compound selected from the group consisting of carbazole, benzocarbazole, indolocarbazole, fluorene, substituted derivatives thereof, and deuterated analogs thereof.

In some embodiments, HT has Formula HT-1

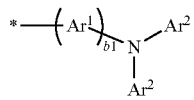

wherein:

Ar¹ is an aryl or deuterated aryl group;

Ar² is the same or different at each occurrence and is an aryl or deuterated aryl group;

b1 is 0 or 1; and

* represents a point of attachment.

In Formula I, when HT has Formula HT-1 and b1=0, then b=1.

In some embodiments of Formula HT-1, Ar¹ has Formula c, or Formula d, as defined above.

In some embodiments of Formula HT-1, Ar¹ is selected from the group consisting of phenyl, biphenyl, terphenyl, naphthyl, anthracenyl, substituted analogs thereof, and deuterated analogs thereof.

In some embodiments of Formula HT-1, Ar² has Formula a or Formula b, as defined above.

In some embodiments of Formula HT-1, Ar² is selected from the group consisting of phenyl, biphenyl, terphenyl, naphthyl, anthracenyl, carbazolyl, combinations of such groups linked together covalently, substituted derivatives thereof, and deuterated analogs thereof.

In some embodiments, HT has Formula HT-1a

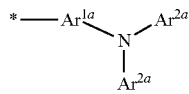

wherein:

Ar¹ᵃ and Ar²ᵃ are the same or different at each occurrence and are derived from a compound selected from the group consisting of fluorene, arylenecarbazole, triarylamine, substituted derivatives thereof, and deuterated analogs thereof; and

* represents a point of attachment.

In some embodiments, HT has Formula HT-2

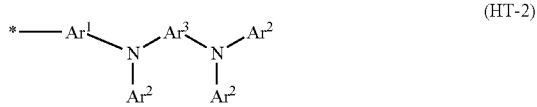

(HT-2)

wherein:
Ar¹ is an aryl or deuterated aryl group;
Ar² is the same or different at each occurrence and is an aryl or deuterated aryl group;
Ar³ is selected from the group consisting of aryl, $(CR'_2)_r$, adamantyl, bicyclic cyclohexyl, a bicyclic group having aliphatic rings connected through a single atom, substituted derivatives thereof, and deuterated analogs thereof;
R' is the same or different at each occurrence and is H, D, alkyl, fluoroalkyl, aryl, deuterated alkyl, deuterated fluoroalkyl, and deuterated aryl; and
* represents a point of attachment.

In some embodiments of Formula HT-2, Ar³ had Formula a or Formula b, as defied above.

In some embodiments of Formula HT-2, Ar³ is selected from the group consisting of phenyl, naphthyl, anthracenyl, substituted derivatives thereof, and deuterated analogs thereof.

All of the above-described embodiments for Ar¹ and Ar² in Formula HT-1, apply equally to Ar¹ and Ar² in Formula HT-2.

In some embodiments, HT has Formula HT-2a

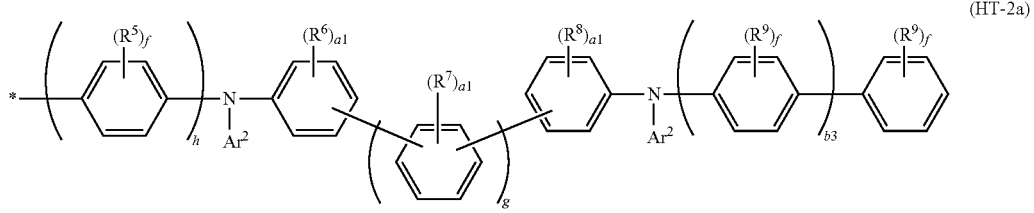

(HT-2a)

wherein:
Ar² is the same or different at each occurrence and is an aryl or deuterated aryl group;
$R^5$ through $R^9$ are independently the same or different at each occurrence and are selected from the group consisting of D, F, CN, alkyl, fluoroalkyl, aryl, heteroaryl, amino, silyl, germyl, alkoxy, aryloxy, fluoroalkoxy, siloxane, siloxy, deuterated alkyl, deuterated partially-fluorinated alkyl, deuterated aryl, deuterated heteroaryl, deuterated amino, deuterated silyl, deuterated germyl, deuterated alkoxy, deuterated aryloxy, deuterated fluoroalkoxy, deuterated siloxane, deuterated siloxy, and crosslinking groups, wherein adjacent $R^5$ or $R^9$ groups can be joined together to form a fused 5- or 6-membered aromatic ring;
a1 is the same or different at each occurrence and is an integer from 0 to 4;
b3 is 0 or 1;
f is the same or different at each occurrence and is 0 to the maximum number of bonding positions available;
g is an integer from 0 to 3;
h is 1 or 2; and
* represents a point of attachment.

In some embodiments of Formula HT-2a, the two Ar² groups are the same.

In some embodiments of Formula HT-2a, the two Ar² groups are different.

In some embodiments of Formula HT-2a, at least one Ar² is an aryl group having no fused rings.

In some embodiments of Formula HT-2a, at least one Ar² has Formula c or Formula d, as defined above.

In some embodiments of Formula HT-2a, Ar² is selected from the group consisting of phenyl, biphenyl, terphenyl, derivatives thereof having one or more substituents selected from the group consisting of alkyl, alkoxy, and silyl, and, deuterated analogs thereof.

In some embodiments of Formula HT-2a, $R^5$ through $R^9$ are D or $C_{1-10}$ alkyl. In some embodiments, the alkyl group is deuterated.

In some embodiments of Formula HT-2a, all a1=0.

In some embodiments of Formula HT-2a, at least one a1>0.

In some embodiments of Formula HT-2a, all f=0.

In some embodiments of Formula HT-2a, at least one f>0.

In some embodiments of Formula HT-2a, b3=1.

In some embodiments of Formula HT-2a, h=2.

In some embodiments of Formula HT-2a, g=1.

In some embodiments of Formula HT-2a, g=2.

In some embodiments, HT has Formula HT-3

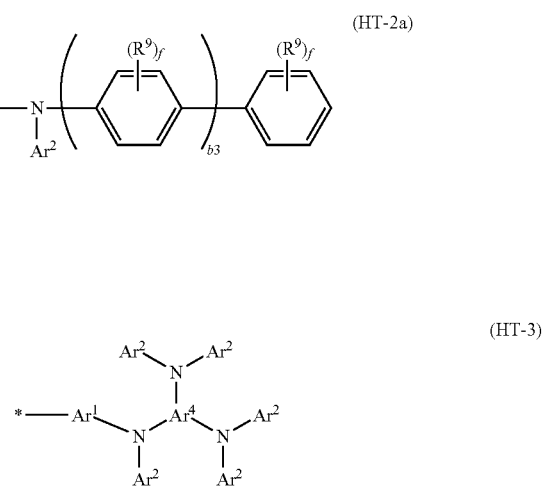

(HT-3)

wherein:
Ar¹ is an aryl or deuterated aryl group;
Ar² is the same or different at each occurrence and is an aryl or deuterated aryl group;
Ar⁴ is an aryl or deuterated aryl group; and
* represents a point of attachment.

All of the above-described embodiments for Ar¹ and Ar² in Formula HT-1, apply equally to Ar¹ and Ar² in Formula HT-3.

In some embodiments of Formula HT-3, Ar⁴ is a fused hydrocarbon aryl group having 10-36 ring carbons, a substituted derivative thereof, or a deuterated analog thereof.

In some embodiments of Formula HT-3, Ar⁴ is derived from a compound selected from the group consisting of benzene, phenylbenzene, naphthalene, anthracene, pyrene, chrysene, substituted derivatives thereof, and deuterated analogs thereof.

In some embodiments, HT has Formula HT-4

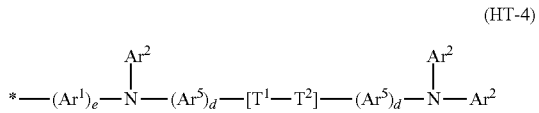

(HT-4)

wherein:
- $Ar^1$ is the same or different at each occurrence and is an aryl group or deuterated aryl group;
- $Ar^2$ is the same or different at each occurrence and is an aryl group or deuterated aryl group;
- $Ar^5$ is the same or different at each occurrence and is selected from the group consisting of phenylene, substituted phenylene, naphthylene, substituted naphthylene, and deuterated analogs thereof;
- $T^1$ and $T^2$ are independently the same or different at each occurrence and are conjugated moieties which are connected in a non-planar configuration, or a deuterated analog thereof;
- d is the same or different at each occurrence and is an integer from 1 to 6;
- e is an integer from 1 to 6; and
- * represents a point of attachment.

In some embodiments of Formula HT-4, at least one $Ar^5$ is a substituted phenyl with a substituent selected from the group consisting of alkyl, alkoxy, silyl, and deuterated analogs thereof.

In some embodiments of Formula HT-4, d is 1-4.
In some embodiments of Formula HT-4, d is 1-3.
In some embodiments of Formula HT-4, d=1.

Any of the aromatic rings in Formula HT-4 may be substituted at any position. The substituents may be present to improve one or more physical properties of the compound, such as solubility. In some embodiments, the substituents are selected from the group consisting of D, $C_{1-12}$ alkyl groups, $C_{1-12}$ alkoxy groups, silyl groups, germyl groups, and deuterated analogs thereof. In some embodiments, the alkyl groups are heteroalkyl groups. In some embodiments, the alkyl groups are fluoroalkyl groups.

All of the above-described embodiments for $Ar^1$ and $Ar^2$ in Formula HT-1, apply equally to $Ar^1$ and $Ar^2$ in Formula HT-4.

In some embodiments of Formula HT-4, at least one $Ar^2$ has a substituent selected from the group consisting of alkyl, alkoxy, silyl, and deuterated analogs thereof.

In Formula HT-4, $T^1$ and $T^2$ are conjugated moieties. In some embodiments, $T^1$ and $T^2$ are aromatic moieties or deuterated aromatic moieties.

In some embodiments of Formula HT-4, $T^1$ and $T^2$ are selected from the group consisting of phenylene, napthylene, anthracenyl, and deuterated analogs thereof.

In some embodiments of Formula HT-4, $[T^1\text{-}T^2]$ is a substituted biphenylene group or deuterated analog thereof. The term "biphenylene" is intended to mean a biphenyl group having two points of attachment to the compound backbone. The term "biphenyl" is intended to mean a group having two phenyl units joined by a single bond. The biphenylene group can be attached at one of the 2, 3-, 4-, or 5-positions and one of the 2', 3'-, 4'-, or 5'-positions. The substituted biphenylene group has at least one substituent in the 2-position. In some embodiments of Formula HT-4, the biphenylene group has substituents in at least the 2- and 2'-positions.

In some embodiments of Formula HT-4, $[T^1\text{-}T^2]$ is a binaphthylene group or deuterated binaphthylene group. The term "binaphthylene" is intended to mean a binapthyl group having 2 points of attachment to the compound backbone. The term "binaphthyl" is intended to mean a group having two naphthalene units joined by a single bond. In some embodiments, the binaphthylene group is a 1,1'-binaphthylene, which is attached to the compound backbone at one of the 3-, 4-, 5-, 6, or 7-positions and one of the 3'-, 4'-, 5'-, 6', or 7'-positions.

In some embodiments of Formula HT-4, $[T^1\text{-}T^2]$ is a phenylene-naphthylene group or a deuterated phenylene-naphthylene group.

In some embodiments of Formula HT-4, the biphenylene, binaphthylene, and phenylene-naphthylene groups are substituted at one or more positions.

In some embodiments of Formula HT-4, $[T^1\text{-}T^2]$ is a 1,1-binaphthylene group which is attached to the group backbone at the 4 and 4' positions, referred to as 4,4'-(1,1-binaphthylene).

In some embodiments, HT has Formula HT-5 or Formula HT-6

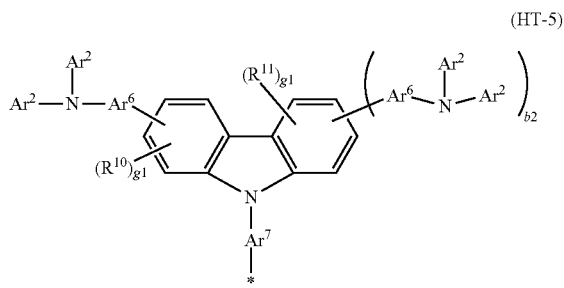

(HT-5)

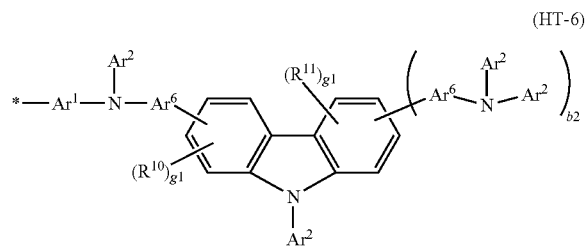

(HT-6)

wherein:
- $Ar^1$ is an aryl group or deuterated aryl group;
- $Ar^2$ is the same or different at each occurrence and is an aryl group or deuterated aryl group;
- $Ar^6$ is the same or different at each occurrence and is an aryl group or deuterated aryl group;
- $Ar^7$ is an aryl group or deuterated aryl group;
- $R^{10}$ and $R^{11}$ are the same or different at each occurrence and are selected from the group consisting of D, F, CN, alkyl, fluoroalkyl, aryl, heteroaryl, amino, silyl, germyl, alkoxy, aryloxy, fluoroalkoxy, siloxane, siloxy, deuterated alkyl, deuterated partially-fluorinated alkyl, deuterated aryl, deuterated heteroaryl, deuterated amino, deuterated silyl, deuterated germyl, deuterated alkoxy, deuterated aryloxy, deuterated fluoroalkoxy, deuterated siloxane, deuterated siloxy, and crosslinking groups, wherein adjacent groups selected from $R^{10}$ and $R^{11}$ can be joined together to form a fused ring;

b2 is 0 or 1;

g1 is the same or different at each occurrence and is an integer from 0-3; and

* represents a point of attachment.

All of the above-described embodiments for $Ar^1$ in Formula HT-1, apply equally to $Ar^1$ and $Ar^6$ in Formula HT-6.

All of the above-described embodiments for $Ar^2$ in Formula HT-1, apply equally to $Ar^2$ in Formula HT-5 and Formula HT-6.

In some embodiments of Formula HT-5, $Ar^7$ has Formula a or Formula b, as defined above.

In some embodiments of Formula HT-5, $Ar^7$ is selected from the group consisting of phenyl, biphenyl, terphenyl, naphthyl, anthracenyl, substituted derivatives thereof, and deuterated analogs thereof.

All of the above-described embodiments for $R^4$ through $R^9$ in Formula HT-2a, apply equally to $R^{19}$ and $R^{11}$ in Formula HT-5 and Formula HT-6.

In some embodiments of Formula HT-5, b2=0.
In some embodiments of Formula HT-5, b2=1.
In some embodiments of Formula HT-5, g2=0.
In some embodiments of Formula HT-5, at least one g2=1.
In some embodiments of Formula HT-5, at least one g2>0.
In some embodiments of Formula HT-6, b2=0.
In some embodiments of Formula HT-6, b2=1.
In some embodiments of Formula HT-6, g2=0.
In some embodiments of Formula HT-6, at least one g2=1.
In some embodiments of Formula HT-6, at least one g2>0.
In some embodiments, HT has Formula HT-7

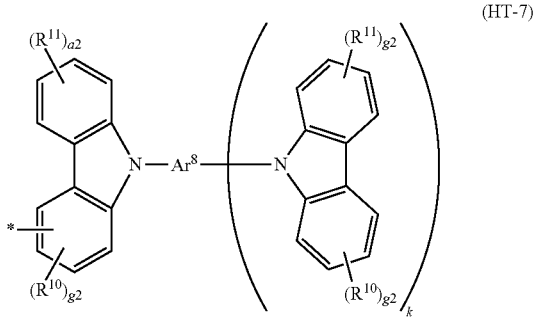

(HT-7)

wherein:
$Ar^8$ is selected from the group consisting of H, D, an aryl group or deuterated aryl group, with the proviso that when k=0, $Ar^8$ is aryl or deuterated aryl;

$R^{10}$ and $R^{11}$ are the same or different at each occurrence and are selected from the group consisting of D, F, CN, alkyl, fluoroalkyl, aryl, heteroaryl, amino, silyl, germyl, alkoxy, aryloxy, fluoroalkoxy, siloxane, siloxy, deuterated alkyl, deuterated partially-fluorinated alkyl, deuterated aryl, deuterated heteroaryl, deuterated amino, deuterated silyl, deuterated germyl, deuterated alkoxy, deuterated aryloxy, deuterated fluoroalkoxy, deuterated siloxane, deuterated siloxy, and crosslinking groups, wherein adjacent groups selected from $R^{19}$ and $R^{11}$ can be joined together to form a fused ring;

a2 is an integer from 0-4;

g2 is the same or different at each occurrence and is an integer from 0-3;

k is an integer from 0-2; and

* represents a point of attachment.

In some embodiments of Formula HT-7, $Ar^8$ has Formula a or Formula b, as defined above.

In some embodiments of Formula HT-7, $Ar^8$ is selected from the group consisting of phenyl, biphenyl, terphenyl, naphthyl, anthracenyl, substituted derivatives thereof, and deuterated analogs thereof.

All of the above-described embodiments for $R^4$ through $R^9$ in Formula HT-2a, apply equally to $R^{19}$ and $R^{11}$ in Formula HT-7.

In some embodiments of Formula HT-7, a2=0.
In some embodiments of Formula HT-7, a2=1.
In some embodiments of Formula HT-7, as >0.
In some embodiments of Formula HT-7, g2=0.
In some embodiments of Formula HT-7, at least one g2=1.
In some embodiments of Formula HT-7, at least one g2>0.

All of the above-described embodiments for $Q^1$ apply equally to $Q^2$.

In some embodiments of Formula I, a=0.
In some embodiments of Formula I, a=1.
In some embodiments of Formula I, a=2.
In some embodiments of Formula I, a=3.
In some embodiments of Formula I, a=4.
In some embodiments of Formula I, a>0.
In some embodiments of Formula I, a>0 and at least one $R^1$=D.

In some embodiments of Formula I, a>0 and at least one $R^1$ is an alkyl or deuterated alkyl group having 1-12 carbons; in some embodiments, 1-8 carbons; in some embodiments, 3-8 carbons.

In some embodiments of Formula I, a>0 and at least one $R^1$ is an alkoxy or deuterated alkoxy group having 1-12 carbons; in some embodiments, 1-8 carbons; in some embodiments, 3-8 carbons.

In some embodiments of Formula I, a>0 and at least one $R^1$ is selected from the group consisting of methyl, ethyl, propyl, butyl, pentyl, hexyl, trimethylsilyl, triethylsilyl, and deuterated analogs thereof.

Any of the above embodiments for Formula I can be combined with one or more of the other embodiments, so long as they are not mutually exclusive. For example, the embodiment in which $L^1$=alkyl having 3-8 carbons can be combined with the embodiment in which the HT has Formula HT-1. The same is true for the other non-mutually-exclusive embodiments discussed above. The skilled person would understand which embodiments were mutually exclusive and would thus readily be able to determine the combinations of embodiments that are contemplated by the present application.

Some non-limiting examples of compounds having Formula I are shown below.

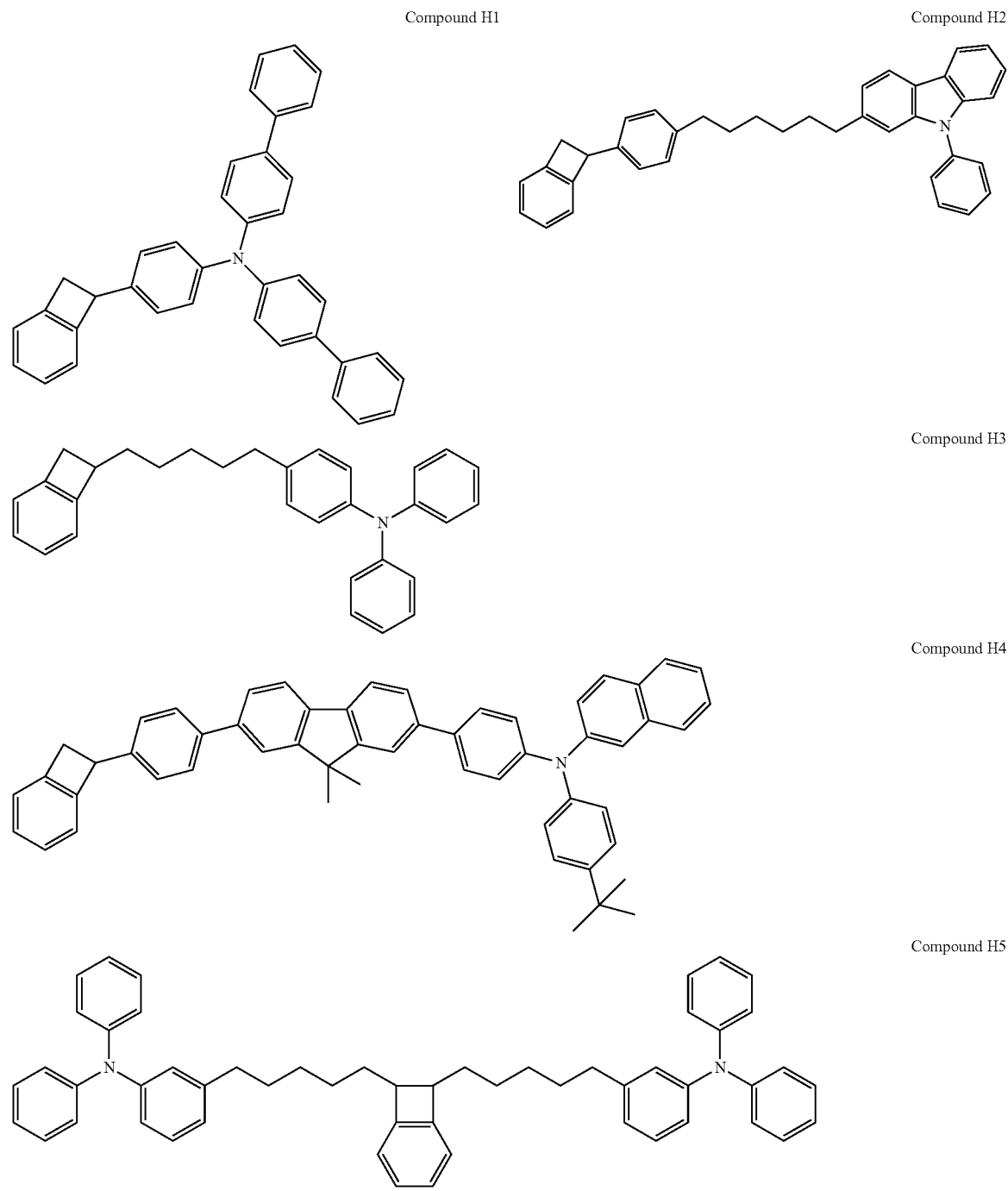

The compounds of Formula I can be made using any technique that will yield a C—C or C—N bond. A variety of such techniques are known, such as Suzuki, Yamamoto, Stille, and metal-catalyzed C—N couplings as well as metal catalyzed and oxidative direct arylation.

Deuterated compounds can be prepared in a similar manner using deuterated precursor materials or, more generally, by treating the non-deuterated compound with deuterated solvent, such as benzene-d6, in the presence of a Lewis acid H/D exchange catalyst, such as trifluoromethanesulfonic acid, aluminum trichloride or ethyl aluminum dichloride.

Exemplary preparations are given in the examples.

The compounds can be formed into layers using solution processing techniques. The term "layer" is used interchangeably with the term "film" and refers to a coating covering a desired area. The term is not limited by size. The area can be as large as an entire device or as small as a specific functional area such as the actual visual display, or as small as a single sub-pixel. Layers and films can be formed by any conventional deposition technique, including vapor deposition, liquid deposition (continuous and discontinuous techniques), and thermal transfer. Continuous deposition techniques, include but are not limited to, spin coating, gravure coating, curtain coating, dip coating, slot-die coating, spray coating, and continuous nozzle coating. Discontinuous deposition techniques include, but are not limited to, ink jet printing, gravure printing, and screen printing.

The new compounds having Formula I can be used as hole transport materials and as hosts for electroluminescent materials. The new compounds also have utility as materials for a priming layer to improve the deposition of a hole transport layer.

3. Polymers and Copolymers

There is also provided a polymer having at least one monomeric unit having Formula III

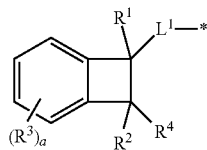

(III)

wherein:
L$^1$ is the same or different at each occurrence and is selected from the group consisting of alkyl, aryl, substituted derivatives thereof, deuterated analogs thereof, and combinations thereof;
R$^1$ and R$^2$ are the same or different and are H or D;
R$^3$ is the same or different at each occurrence and is selected from the group consisting of D, CN, halogen, alkyl, alkoxy, silyl, germyl, deuterated alkyl, deuterated alkoxy, deuterated silyl, and deuterated germyl;
R$^4$ is selected from the group consisting of H, D, and L$^1$;
a is an integer from 0-4; and
* indicates a point of attachment.

In some embodiments of Formula III, R$^4$ is H.
In some embodiments of Formula III, R$^4$ is D.
In some embodiments of Formula III, R$^4$ is L$^1$.

All of the above-described embodiments for R$^1$, R$^2$, R$^3$, L$^1$, and a in Formula I, apply equally to R$^1$, R$^2$, R$^3$, L$^1$, and a in Formula III. There is further provided a copolymer having Formula IV

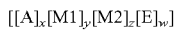

(IV)

wherein:
A is a monomeric unit containing at least one hole transport group;
M1 is a monomeric unit having at least three points of attachment in the copolymer;
M2 is an aromatic monomeric unit having two points of attachment or a deuterated analog thereof;
E is a monomeric unit having Formula III-a

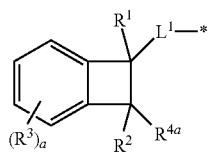

(III-a)

wherein:
L$^1$ is selected from the group consisting of alkyl, aryl, substituted derivatives thereof, deuterated analogs thereof, and combinations thereof;
R$^1$ and R$^2$ are the same or different and are H or D;
R$^3$ is the same or different at each occurrence and is selected from the group consisting of D, CN, halogen, alkyl, alkoxy, silyl, germyl, deuterated alkyl, deuterated alkoxy, deuterated silyl, and deuterated germyl;
R$^{4a}$ is H or D;
a is an integer from 0-4;
x, y, z and w are the same or different and are mole fractions, where at least x and w are non-zero; and
* indicates a point of attachment.

In some embodiments of Formula I, the "A", "E", and optional "M1" and "M2" units are ordered in a regular alternating pattern.

In some embodiments of Formula I, the "A", "E", and optional "M1" and "M2" units are ordered in blocks of like monomers.

In some embodiments of Formula I, the "A", "E", and optional "M1" and "M2" units are randomly arranged.

In some embodiments, the distribution of monomeric segments can be manipulated so as to optimize properties of compounds having Formula I for use in electronic devices. In some embodiments, the different distribution can result in differential degrees of non-associative packing that ultimately determines the associated film-forming properties.

In some embodiments, the copolymer having Formula IV is deuterated. In some embodiments, the copolymer is at least 10% deuterated; in some embodiments, at least 20% deuterated; in some embodiments, at least 30% deuterated; in some embodiments, at least 40% deuterated; in some embodiments, at least 50% deuterated; in some embodiments, at least 60% deuterated; in some embodiments, at least 70% deuterated; in some embodiments, at least 80% deuterated; in some embodiments, at least 90% deuterated; in some embodiments, 100% deuterated.

The deuteration can be present on one or more of monomeric units A, E, M1 and M2. The deuteration can be present on the copolymer backbone, on pendant groups, or both.

In some embodiments of Formula IV, the copolymer has a M$_n$>10,000. In some embodiments, the copolymer has a M$_n$>20,000; in some embodiments, M$_n$>50,000; in some embodiments, M$_n$>100,000; in some embodiments, M$_n$>150,000.

In some embodiments of Formula IV, x is in the range of 0.3-0.9; in some embodiments, 0.4-0.8; in some embodiments, 0.5-0.80.

In some embodiments of Formula IV, y is in the range of 0-0.30; in some embodiments, 0.05-0.20; in some embodiments, 0.10-0.15.

In some embodiments of Formula IV, z is in the range of 0-0.30; in some embodiments, 0.05-0.20; in some embodiments, 0.10-0.15.

In some embodiments of Formula IV, w is in the range of 0.05-0.30; in some embodiments, 0.10-0.20; in some embodiments, 0.10-0.15.

In some embodiments of Formula IV, monomeric unit A includes a moiety selected from the group consisting of arylamino, N-heterocyclic, fused hydrocarbon aromatic, substituted derivatives thereof, combinations thereof, and deuterated analogs thereof.

In some embodiments of Formula IV, monomeric unit A is selected from the group consisting of diarylamino, triarylamino, substituted derivatives thereof, and deuterated analogs thereof. In some embodiments, monomeric unit A is a monomer comprising at least two arylamino groups.

In some embodiments of Formula IV, monomeric unit A is an N-heterocyclic group having one or more nitrogen heteroatoms and no other heteroatoms, or a deuterated analog thereof.

In some embodiments, the N-heterocyclic group having only nitrogen heteroatom(s) is derived from a compound selected from the group consisting of carbazole, benzocarbazole, azacarbazole, acridan, indole, indoloindole, indolocarbazole, imidazole, benzimidazole, pyrrolopyrrole, diazine, pyridine, pyrimidine, pyridazine, pyrazine, triazine, triazolopyridine, quinoline, isoquinoline, substituted derivatives thereof, and deuterated analogs thereof.

In some embodiments of Formula IV, monomeric unit A is an N-heterocyclic group having at least one nitrogen heteroatom and at least one oxygen or sulfur heteroatom.

In some embodiments, the N-heterocyclic group is derived from a compound selected from the group consisting of oxazine, phenoxazine, oxazole, benzoxazole, phenothiazine, benzothiazole, benzothiadiazole, substituted derivatives thereof, and deuterated analogs thereof.

In some embodiments of Formula IV, monomeric unit A is a hydrocarbon aryl group having fused rings or a deuterated analog thereof.

In some embodiments, the hydrocarbon aryl group is derived from a compound selected from the group consisting of fluorene, anthracene, benzanthracene, triphenylene, indane, indenofluorene, substituted derivatives thereof, and deuterated analogs thereof.

In some embodiments of Formula IV, monomeric unit A comprises at least one arylamino group and a second group derived from a compound selected from the group consisting of carbazole, benzocarbazole, indolocarbazole, fluorene, substituted derivatives thereof, and deuterated analogs thereof.

In some embodiments of Formula IV, monomeric unit A has Formula A-1

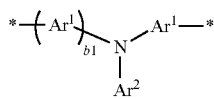

(A-1)

wherein:
Ar$^1$ is the same or different at each occurrence and is an aryl or deuterated aryl group;
Ar$^2$ is an aryl or deuterated aryl group;
b1 is 0 or 1; and
* represents a point of attachment.

All of the above-describe embodiments for Ar$^1$, Ar$^2$, and b1 in Formula HT-1, apply equally to Ar$^1$, Ar$^2$, and b1 in Formula A-1.

In some embodiments of Formula IV, monomeric unit A has Formula A-1a

(A-1a)

wherein:
Ar$^{1a}$ and Ar$^{2a}$ are the same or different at each occurrence and are derived from a compound selected from the group consisting of fluorene, arylenecarbazole, triarylamine, substituted derivatives thereof, and deuterated analogs thereof; and
* represents a point of attachment.

In some embodiments of Formula IV, monomeric unit A has Formula A-2

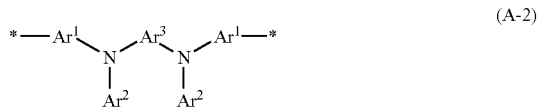

(A-2)

wherein:
Ar$^1$ is the same or different at each occurrence and is an aryl or deuterated aryl group;
Ar$^2$ is the same or different at each occurrence and is an aryl or deuterated aryl group;
Ar$^3$ is an aryl or deuterated aryl group; and
* represents a point of attachment.

All of the above-described embodiments for Ar$^1$, Ar$^2$, and Ar$^3$ in Formula HT-2, apply equally to Ar$^1$, Ar$^2$, and Ar$^3$ in Formula A-2.

In some embodiments of Formula IV, monomeric unit A has Formula A-2a

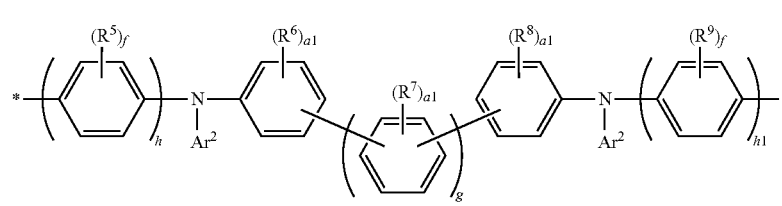

(A-2a)

wherein:
Ar$^2$ is the same or different at each occurrence and is an aryl or deuterated aryl group;
R$^5$ through R$^9$ are independently the same or different at each occurrence and are selected from the group consisting of D, F, CN, alkyl, fluoroalkyl, aryl, heteroaryl, amino, silyl, germyl, alkoxy, aryloxy, fluoroalkoxy, siloxane, siloxy, deuterated alkyl, deuterated partially-fluorinated alkyl, deuterated aryl, deuterated heteroaryl, deuterated amino, deuterated silyl, deuterated germyl, deuterated alkoxy, deuterated aryloxy, deuterated fluoroalkoxy, deuterated siloxane, deuterated siloxy, and crosslinking groups, wherein adjacent $R^5$ or $R^9$ groups can be joined together to form a fused 5- or 6-membered aromatic ring;

a1 is the same or different at each occurrence and is an integer from 0 to 4;

f is the same or different at each occurrence and is 0 to the maximum number of bonding positions available;

g is an integer from 0 to 3;

h and h1 are the same or different and are 1 or 2; and

* represents a point of attachment.

In some embodiments of Formula HT-2a, h1=2.

All of the above-described embodiments for $Ar^2$, $R^5$ through $R^9$, a1, h, and g in Formula HT-2a, apply equally to $Ar^2$, $R^5$ through $R^9$, a1, h, and g in Formula A-2a.

In some embodiments of Formula IV, monomeric unit A has Formula A-3

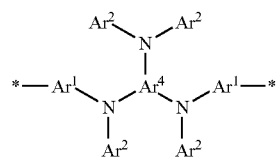
(A-3)

All of the above-described embodiments for $Ar^1$, $Ar^2$, and $Ar^4$ in Formula HT-3, apply equally to $Ar^1$, $Ar^2$, and $Ar^4$ in Formula A-3.

In some embodiments of Formula IV, monomeric unit A has Formula A-4

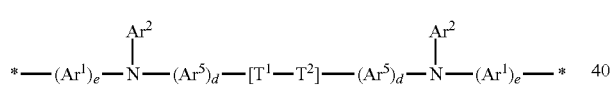
(A-4)

wherein:

$Ar^1$ is the same or different at each occurrence and is an aryl group or deuterated aryl group;

$Ar^2$ is the same or different at each occurrence and is an aryl group or deuterated aryl group;

$Ar^5$ is the same or different at each occurrence and is selected from the group consisting of phenylene, substituted phenylene, naphthylene, substituted naphthylene, and deuterated analogs thereof;

$T^1$ and $T^2$ are independently the same or different at each occurrence and are conjugated moieties which are connected in a non-planar configuration, or a deuterated analog thereof;

d is the same or different at each occurrence and is an integer from 1 to 6;

e is the same or different at each occurrence and is an integer from 1 to 6; and

* represents a point of attachment.

All of the above-described embodiments for $Ar^1$, $Ar^2$, $Ar^5$, $T^1$, $T^2$, d, and e in Formula HT-4, apply equally to $Ar^1$, $Ar^2$, $Ar^5$, $T^1$, $T^2$, d, and e in Formula A-4.

In some embodiments of Formula IV, monomeric unit A has Formula A-5 or Formula A-6

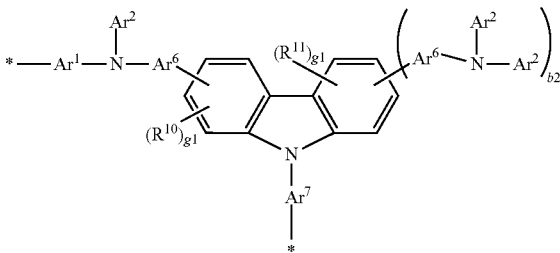
(A-5)

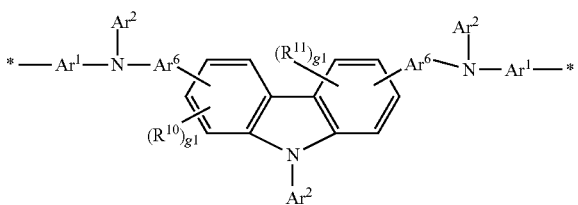
(A-6)

wherein:

$Ar^1$ is an aryl group or deuterated aryl group;

$Ar^2$ is the same or different at each occurrence and is an aryl group or deuterated aryl group;

$Ar^6$ is the same or different at each occurrence and is an aryl group or deuterated aryl group;

$Ar^7$ is an aryl group or deuterated aryl group;

$R^{10}$ and $R^{11}$ are the same or different at each occurrence and are selected from the group consisting of D, F, CN, alkyl, fluoroalkyl, aryl, heteroaryl, amino, silyl, germyl, alkoxy, aryloxy, fluoroalkoxy, siloxane, siloxy, deuterated alkyl, deuterated partially-fluorinated alkyl, deuterated aryl, deuterated heteroaryl, deuterated amino, deuterated silyl, deuterated germyl, deuterated alkoxy, deuterated aryloxy, deuterated fluoroalkoxy, deuterated siloxane, deuterated siloxy, and crosslinking groups, wherein adjacent groups selected from $R^{10}$ and $R^{11}$ can be joined together to form a fused ring;

b2 is 0 or 1;

g1 is the same or different at each occurrence and is an integer from 0-3; and

* represents a point of attachment.

All of the above-described embodiments for $Ar^1$, $Ar^2$, $Ar^6$, $Ar^7$, $R^{10}$, $R^{11}$, b2, and g1 in Formula HT-5 and Formula HT-6, apply equally to $Ar^1$, $Ar^2$, $Ar^6$, $Ar^7$, $R^{10}$, $R^{11}$, b2, and g1 in Formula A-5 and Formula A-6.

In some embodiments of Formula IV, monomeric unit A has Formula A-7

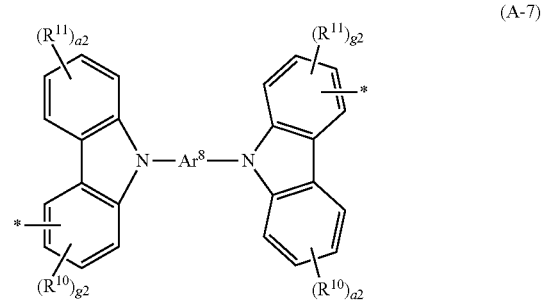
(A-7)

wherein:
Ar$^8$ is selected from the group consisting of H, D, an aryl group or deuterated aryl group, with the proviso that when k=0, Ar$^8$ is aryl or deuterated aryl;
R$^{10}$ and R$^{11}$ are the same or different at each occurrence and are selected from the group consisting of D, F, CN, alkyl, fluoroalkyl, aryl, heteroaryl, amino, silyl, germyl, alkoxy, aryloxy, fluoroalkoxy, siloxane, siloxy, deuterated alkyl, deuterated partially-fluorinated alkyl, deuterated aryl, deuterated heteroaryl, deuterated amino, deuterated silyl, deuterated germyl, deuterated alkoxy, deuterated aryloxy, deuterated fluoroalkoxy, deuterated siloxane, deuterated siloxy, and crosslinking groups, wherein adjacent groups selected from R$^{10}$ and R$^{11}$ can be joined together to form a fused ring;
a2 is the same or different at each occurrence and is an integer from 0-4;
g2 is an integer from 0-3;
k is an integer from 0-2; and
* represents a point of attachment.

All of the above-described embodiments for Ar$^8$, R$^{10}$, R$^{11}$, a2, and g2 in Formula HT-7, apply equally Ar$^8$, R$^{10}$, R$^{11}$, a2, and g2 in Formula A-7.

Monomeric unit M1 is a branching monomeric unit having at least three points of attachment in the copolymer.

In some embodiments, monomeric unit M1 is aromatic.

In some embodiments, monomeric unit M1 is aromatic with alkyl branching groups.

In some embodiments, monomeric unit M1 is aromatic with aromatic branching groups.

In some embodiments, monomeric unit M1 is a triarylamine group.

In some embodiments, monomeric unit M1 has Formula VI

   (VI)

wherein:
Z is selected from the group consisting of C, Si, Ge, N, a cyclic aliphatic moiety, an aromatic moiety, a deuterated cyclic aliphatic moiety, or a deuterated aromatic moiety, where A has at least three bonding positions;
Y is a single bond, an alkyl, an aromatic moiety, a deuterated alkyl, or a deuterated aromatic moiety, provided that when Y is a single bond, alkyl, or deuterated alkyl, Z is an aromatic or deuterated aromatic moiety;
s is an integer from 3 to the maximum number of bonding positions available on Z; and
* represents a point of attachment in the copolymer.

In some embodiments of Formula VI, Z is an aromatic moiety derived from a compound selected from benzene, naphthalene, anthracene, phenanthrene, substituted derivatives thereof, and deuterated analogs thereof.

In some embodiments, monomeric unit M1 has one of Formula VII, Formula VIII, Formula IX, and Formula X

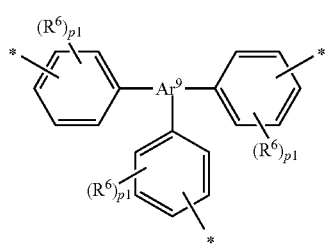   (VII)

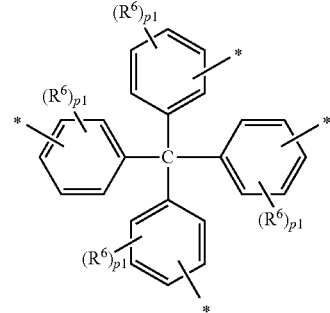   (VIII)

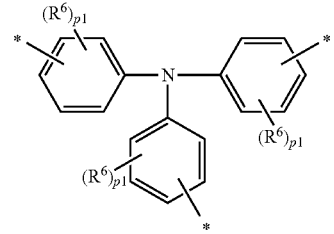   (IX)

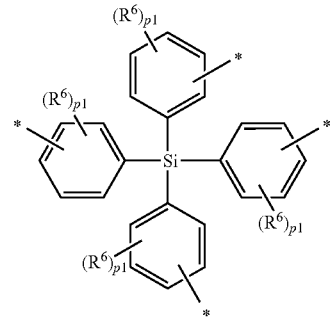   (X)

wherein:
Ar$^9$ is an aromatic moiety or a deuterated aromatic moiety having at least three bonding positions;
R$^6$ is independently the same or different at each occurrence and is selected from the group consisting of D, F, CN, alkyl, fluoroalkyl, aryl, heteroaryl, amino, silyl, germyl, alkoxy, aryloxy, fluoroalkoxy, siloxane, siloxy, deuterated alkyl, deuterated partially-fluorinated alkyl, deuterated aryl, deuterated heteroaryl, deuterated amino, deuterated silyl, deuterated germyl, deuterated alkoxy, deuterated aryloxy, deuterated fluoroalkoxy, deuterated siloxane, deuterated siloxy, and crosslinking groups, wherein adjacent R$^6$ groups can be joined together to form a fused 5- or 6-membered aromatic ring;
p1 is the same or different at each occurrence and is an integer from 0 to 4;
* represents a point of attachment in the copolymer.

Some non-limiting examples of monomeric unit M1 are shown below.

M1-1 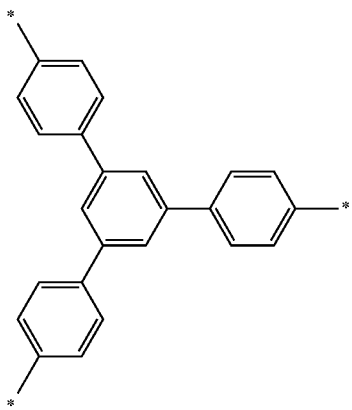
M1-2 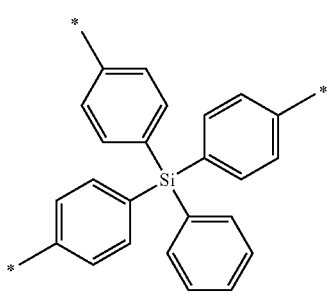
M1-3 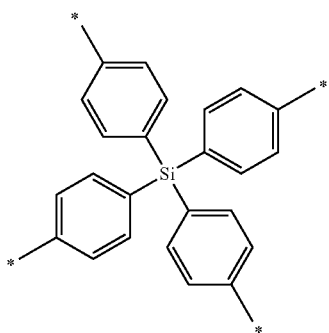
M1-4 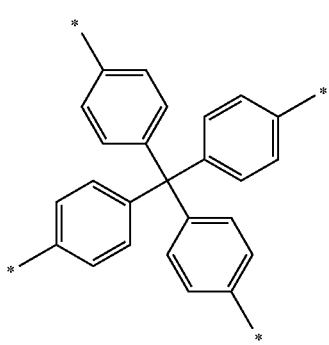
M1-5 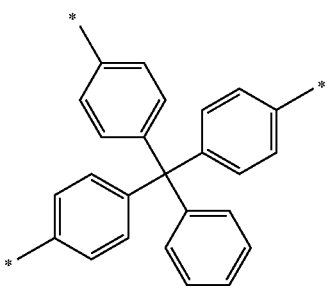
M1-6 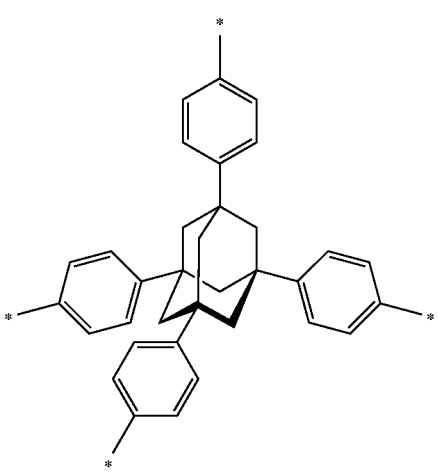
M1-7 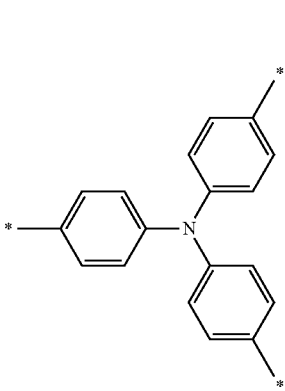
M1-8 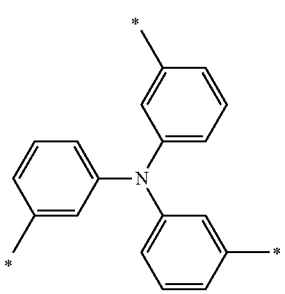

M1-9
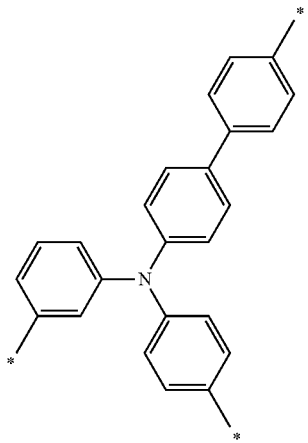
Monomeric unit M2 is an optional monomeric unit that is aromatic.
In some embodiments, monomeric unit M2 has one of the formulae given below.
M2-1
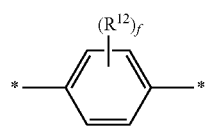
M2-2
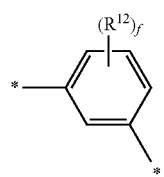
M2-3
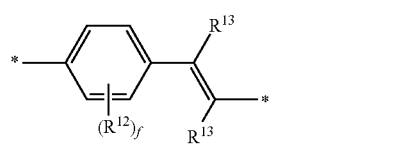
M2-4
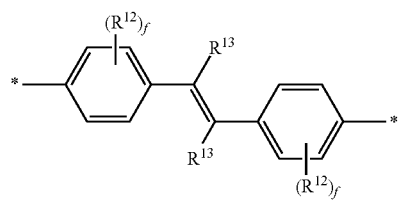
M2-5
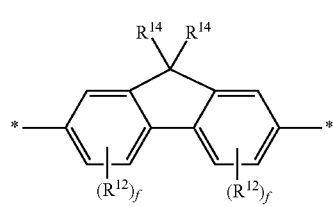
M2-6
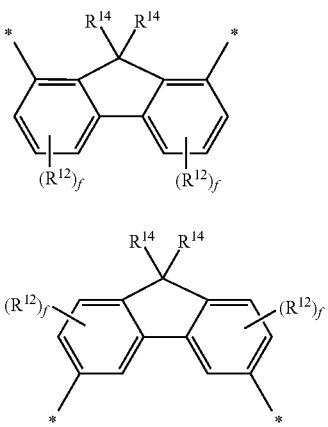
M2-7
M2-8
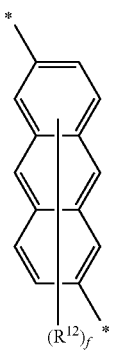
M2-9
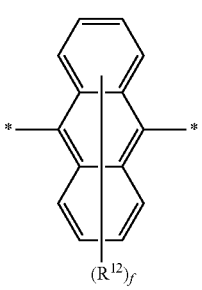
M2-10
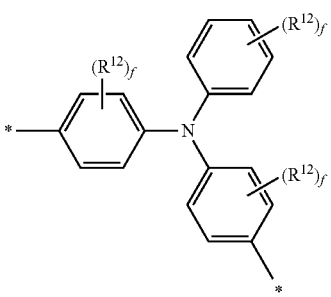

-continued

M2-11
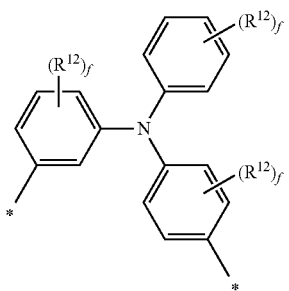

M2-12
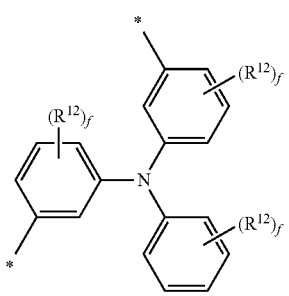

M2-13
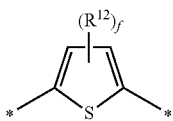

M2-14
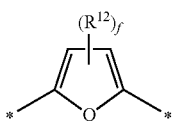

M2-15
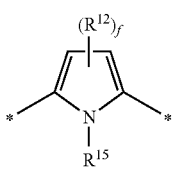

M2-16
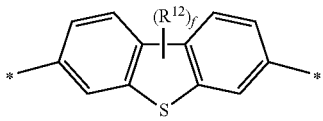

M2-17
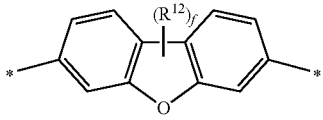

M2-18
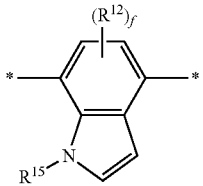

In M2-1 through M2-18:

$R^{12}$ is the same or different at each occurrence and is selected from the group consisting of D, alkyl, silyl, germyl, aryl, deuterated alkyl, deuterated silyl, deuterated germyl, and deuterated aryl;

$R^{13}$ is the same or different at each occurrence and is selected from the group consisting of H, D, alkyl, and deuterated alkyl;

$R^{14}$ is the same or different at each occurrence and is selected from the group consisting of alkyl, aryl, and deuterated analogs thereof;

$R^{15}$ is the same or different at each occurrence and is selected from the group consisting of aryl and deuterated aryl;

f is the same or different at each occurrence and is an integer from 0 to the maximum number of positions available for substituents;

t is an integer of 0-20; and

* represents a point of attachment.

In some embodiments of M2-1 through M2-18, f=0.

In some embodiments of M2-1 through M2-18, at least one f>0 and $R^{12}$=D.

In some embodiments of M2-1 through M2-18, at least one f>0 and $R^{12}$=alkyl having 1-12 carbons, or deuterated analog thereof.

Some non-limiting examples of optional monomeric unit M2 are shown below.

M2-19
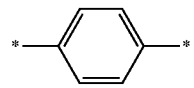

M2-20
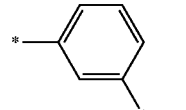

M2-21
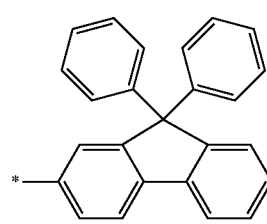

M2-22
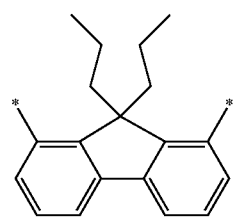

Monomeric unit E is a monomer having Formula III-a.

Any of the above embodiments for monomeric units A, M1, M2 and E can be combined with one or more of the other embodiments, so long as they are not mutually exclusive.

Some non-limiting examples of compounds having Formula I are shown below.

Copolymer H1

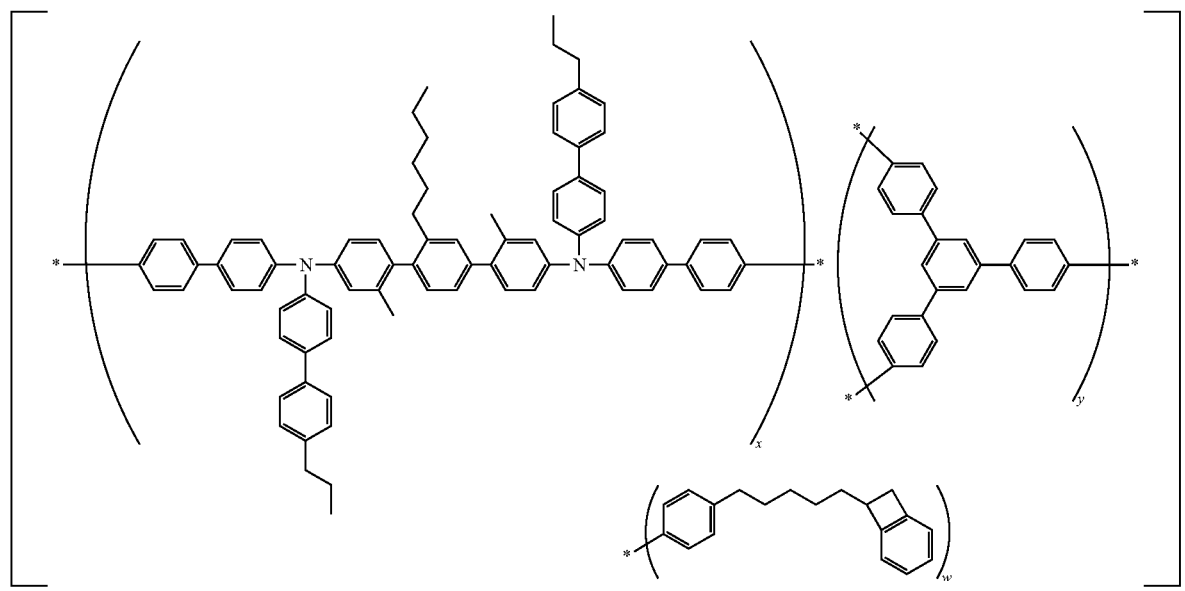

In copolymer H1, z=0 and no monomeric unit M2 is present.

In one embodiment, the ratio x:y:w=58:12:30.

In one embodiment, the ratio x:y:w=76:12:12.

The copolymers having Formula IV can be made using any technique that will yield a C—C or C—N bond and known polymerization techniques. A variety of such techniques are known, such as Suzuki, Yamamoto, Stille, and metal-catalyzed C—N couplings as well as metal catalyzed and oxidative direct arylation.

Deuterated compounds can be prepared in a similar manner using deuterated precursor materials or, more generally, by treating the non-deuterated compound with deuterated solvent, such as benzene-d6, in the presence of a Lewis acid H/D exchange catalyst, such as trifluoromethanesulfonic acid, aluminum trichloride or ethyl aluminum dichloride.

The copolymers can be formed into layers using solution processing techniques. Layers and films can be formed by any conventional deposition technique, including vapor deposition, liquid deposition (continuous and discontinuous techniques), and thermal transfer. Continuous deposition techniques, include but are not limited to, spin coating, gravure coating, curtain coating, dip coating, slot-die coating, spray coating, and continuous nozzle coating. Discontinuous deposition techniques include, but are not limited to, ink jet printing, gravure printing, and screen printing.

The new copolymers having Formula IV can be used as hole transport materials and as hosts for electroluminescent materials. The new copolymers also have utility in one or more layers between the hole injection layer and the hole transport layer.

4. Electronic Devices

Organic electronic devices that may benefit from having one or more layers including at least one compound as described herein include, but are not limited to, (1) devices that convert electrical energy into radiation (e.g., a light-emitting diode, light emitting diode display, lighting device, luminaire, or diode laser), (2) devices that detect signals through electronics processes (e.g., photodetectors, photo-conductive cells, photoresistors, photoswitches, phototransistors, phototubes, IR detectors, biosensors), (3) devices that convert radiation into electrical energy, (e.g., a photovoltaic device or solar cell), (4) devices that convert light of one wavelength to light of a longer wavelength, (e.g., a down-converting phosphor device); and (5) devices that include one or more electronic components that include one or more organic semi-conductor layers (e.g., a transistor or diode). Other uses for the compositions according to the present invention include coating materials for memory storage devices, antistatic films, biosensors, electrochromic devices, solid electrolyte capacitors, energy storage devices such as a rechargeable battery, and electromagnetic shielding applications.

One illustration of an organic electronic device structure including a compound having Formula I or a copolymer having Formula IV is shown in FIG. 1. The device 100 has a first electrical contact layer, an anode layer 110 and a second electrical contact layer, a cathode layer 160, and a photoactive layer 140 between them. Additional layers may optionally be present. Adjacent to the anode may be a hole injection layer 120, sometimes referred to as a buffer layer. Adjacent to the hole injection layer may be a hole transport layer 130, including hole transport material. Adjacent to the cathode may be an electron transport layer 150, including an electron transport material. As an option, devices may use one or more additional hole injection or hole transport layers (not shown) next to the anode 110 and/or one or more additional electron injection or electron transport layers (not shown) next to the cathode 160. Layers 120 through 150 are individually and collectively referred to as the organic active layers.

Figure 2:
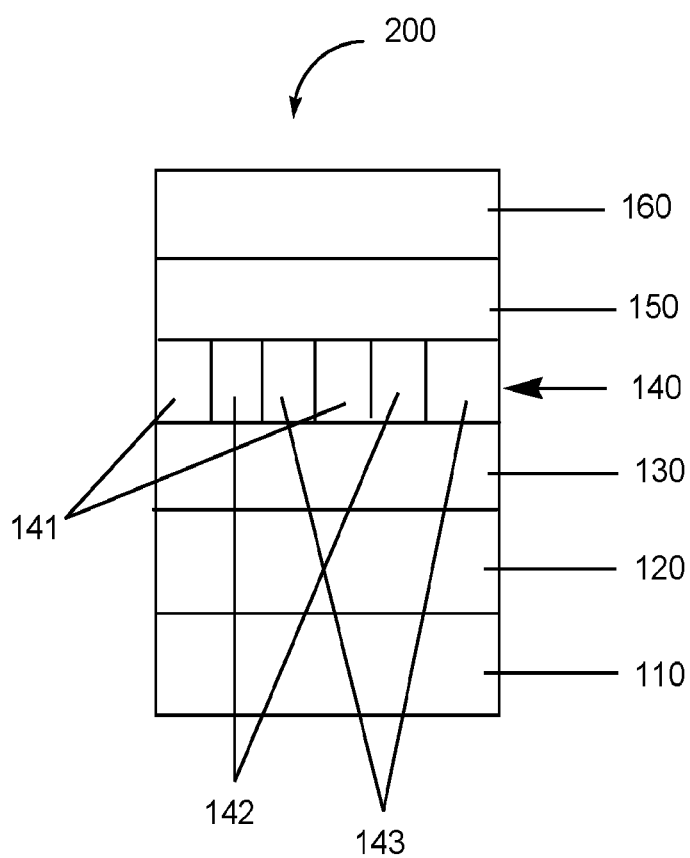
FIG. 2 includes an illustration of another example of an organic electronic device.

In some embodiments, in order to achieve full color, the light-emitting layer is pixelated, with subpixel units for each of the different colors. An illustration of a pixelated device including the compound having Formula I or the copolymer having Formula IV is shown in FIG. 2. The device 200 has anode 110, hole injection layer 120, hole transport layer 130, electroluminescent layer 140, electron transport layer 150, and cathode 160. The electroluminescent layer is divided into subpixels 141, 142, 143, which are repeated across the layer. In some embodiments, the subpixels represent red, blue and green color emission. Although three different subpixel units are depicted in FIG. 2, two or more than three subpixel units may be used.

The different layers will be discussed further herein with reference to FIG. 1. However, the discussion applies to FIG. 2 and other configurations as well.

In some embodiments, the different layers have the following range of thicknesses: anode 110, 500-5000 Å, in some embodiments, 1000-2000 Å; hole injection layer 120, 50-2000 Å, in some embodiments, 200-1000 Å; hole transport layer 130, 50-3000 Å, in some embodiments, 200-2000 Å; photoactive layer 140, 10-2000 Å, in some embodiments, 100-1000 Å; electron transport layer 150, 50-2000 Å, in some embodiments, 100-1000 Å; cathode 160, 200-10000 Å, in some embodiments, 300-5000 Å. The desired ratio of layer thicknesses will depend on the exact nature of the materials used.

One or more of the new compounds having Formula I or Formula II described herein may be present in one or more of the electroactive layers of a device. In some embodiments, the new compounds are useful as hole transport materials in layer 130. In some embodiments, the new compounds are useful as host materials for photoactive dopant materials in photoactive layer 140. The term "dopant" is intended to mean a material, within a layer including a host material, that changes the electronic characteristic(s) or the targeted wavelength(s) of radiation emission, reception, or filtering of the layer compared to the electronic characteristic(s) or the wavelength(s) of radiation emission, reception, or filtering of the layer in the absence of such material. The term "host material" is intended to mean a material to which a dopant is added. The host material may or may not have electronic characteristic(s) or the ability to emit, receive, or filter radiation. In some embodiments, the host material is present in higher concentration.

In some embodiments, an organic electronic device includes an anode, a cathode, and at least one organic active layer therebetween, where the organic active layer includes a compound of Formula I.

In some embodiments, an organic electronic device includes an anode, a cathode, and a photoactive layer therebetween, and further includes an additional organic active layer including a compound of Formula I. In some embodiments, the additional organic active layer is a hole transport layer.

In some embodiments, an organic electronic device includes an anode, a cathode, and at least one organic active layer therebetween, where the organic active layer includes a compound of Formula II.

In some embodiments, an organic electronic device includes an anode, a cathode, and a photoactive layer therebetween, and further includes an additional organic active layer including a compound of Formula II. In some embodiments, the additional organic active layer is a hole transport layer.

The anode 110 is an electrode that is particularly efficient for injecting positive charge carriers. It can be made of, for example materials containing a metal, mixed metal, alloy, metal oxide or mixed-metal oxide, or it can be a conducting polymer, and mixtures thereof. Suitable metals include the Group 11 metals, the metals in Groups 4, 5, and 6, and the Group 8-10 transition metals. If the anode is to be light-transmitting, mixed-metal oxides of Groups 12, 13 and 14 metals, such as indium-tin-oxide, are generally used. The anode may also include an organic material such as polyaniline as described in "Flexible light-emitting diodes made from soluble conducting polymer," Nature vol. 357, pp 477 479 (11 Jun. 1992). At least one of the anode and cathode should be at least partially transparent to allow the generated light to be observed.

Optional hole injection layer 120 includes hole injection materials. The term "hole injection layer" or "hole injection material" is intended to mean electrically conductive or semiconductive materials and may have one or more functions in an organic electronic device, including but not limited to, planarization of the underlying layer, charge transport and/or charge injection properties, scavenging of impurities such as oxygen or metal ions, and other aspects to facilitate or to improve the performance of the organic electronic device. Hole injection materials may be polymers, oligomers, or small molecules, and may be in the form of solutions, dispersions, suspensions, emulsions, colloidal mixtures, or other compositions.

The hole injection layer can be formed with polymeric materials, such as polyaniline (PANI) or polyethylenedioxythiophene (PEDOT), which are often doped with protonic acids. The protonic acids can be, for example, poly(styrenesulfonic acid), poly(2-acrylamido-2-methyl-1-propanesulfonic acid), and the like. The hole injection layer 120 can include charge transfer compounds, and the like, such as copper phthalocyanine and the tetrathiafulvalene-tetracyanoquinodimethane system (TTF-TCNQ). In some embodiments, the hole injection layer 120 is made from a dispersion of a conducting polymer and a colloid-forming polymeric acid. Such materials have been described in, for example, published U.S. patent applications 2004-0102577, 2004-0127637, and 2005-0205860.

Layer 130 includes hole transport material. In some embodiments, the hole transport layer includes a compound having Formula I or Formula II.

In some embodiments, the hole transport layer includes only a compound having Formula I, where additional materials that would materially alter the principle of operation or the distinguishing characteristics of the layer are not present therein.

In some embodiments, the hole transport layer includes only a compound having Formula II, where additional materials that would materially alter the principle of operation or the distinguishing characteristics of the layer are not present therein.

In some embodiments, layer 130 includes other hole transport material. Examples of hole transport materials for the hole transport layer have been summarized for example, in Kirk-Othmer Encyclopedia of Chemical Technology, Fourth Edition, Vol. 18, p. 837-860, 1996, by Y. Wang. Both hole transporting small molecules and polymers can be used. Commonly used hole transporting molecules include, but are not limited to: 4,4',4"-tris(N,N-diphenyl-amino)-triphenylamine (TDATA); 4,4',4"-tris(N-3-methylphenyl-N-phenyl-amino)-triphenylamine (MTDATA); N,N'-diphenyl-N,N"-bis(3-methylphenyl)-[1,1'-biphenyl]-4,4'-diamine (TPD); 4, 4'-bis(carbazol-9-yl)biphenyl (CBP); 1,3-bis(carbazol-9-yl)benzene (mCP); 1,1-bis[(di-4-tolylamino) phenyl]cyclohexane (TAPC); N, N'-bis(4-methylphenyl)-N,N-bis(4-ethylphenyl)-[1,1'-(3,3'-dimethyl)biphenyl]-4,4'-diamine (ETPD); tetrakis-(3-methylphenyl)-N,N,N',N'-2,5-phenylenediamine (PDA); a-phenyl-4-N,N-diphenylaminostyrene (TPS); p-(diethylamino) benzaldehyde diphenylhydrazone (DEH); triphenylamine (TPA); bis[4-(N,N-diethylamino)-2-methylphenyl](4-methylphenyl)methane (MPMP); 1-phenyl-3[p-(diethylamino) styryl]-5-[p-(diethylamino)phenyl] pyrazoline (PPR or DEASP); 1,2-trans-bis(9H-carbazol-9-yl)cyclobutane (DCZB); N,N,N',N'-tetrakis(4-methylphenyl)-(1,1'-biphenyl)-4,4'-diamine (TTB); N,N'-bis(naphthalen-1-yl)-N,N'-bis-(phenyl)benzidine (α-NPB); and porphyrinic compounds, such as copper phthalocyanine. Commonly used hole transporting polymers include, but are not limited to, polyvinylcarbazole, (phenylmethyl)polysilane, poly(dioxythiophenes), polyanilines, and polypyrroles. It is also possible to obtain hole transporting polymers by doping hole transporting molecules such as those mentioned above into polymers such as polystyrene and polycarbonate. In some cases, triarylamine polymers are used, especially triarylamine-fluorene copolymers. In some cases, the polymers and copolymers are crosslinkable. Examples of crosslinkable hole transport polymers can be found in, for example, published US patent application 2005-0184287 and published PCT application WO 2005/052027. In some embodiments, the hole transport layer is doped with a p-dopant, such as tetrafluorotetracyanoquinodimethane and perylene-3,4,9,10-tetracarboxylic-3,4,9,10-dianhydride.

Depending upon the application of the device, the photoactive layer 140 can be a light-emitting layer that is activated by an applied voltage (such as in a light-emitting diode or light-emitting electrochemical cell), a layer of material that absorbs light and emits light having a longer wavelength (such as in a down-converting phosphor device), or a layer of material that responds to radiant energy and generates a signal with or without an applied bias voltage (such as in a photodetector or photovoltaic device).

In some embodiments, the photoactive layer includes an organic electroluminescent ("EL") material. Any EL material can be used in the devices, including, but not limited to, small molecule organic fluorescent compounds, fluorescent and phosphorescent metal complexes, conjugated polymers, and mixtures thereof. Examples of fluorescent compounds include, but are not limited to, chrysenes, pyrenes, perylenes, rubrenes, coumarins, anthracenes, thiadiazoles, derivatives thereof, and mixtures thereof. Examples of metal complexes include, but are not limited to, metal chelated oxinoid compounds, such as tris(8-hydroxyquinolato)aluminum (Alq3); cyclometalated iridium and platinum electroluminescent compounds, such as complexes of iridium with phenylpyridine, phenylquinoline, or phenylpyrimidine ligands as disclosed in Petrov et al., U.S. Pat. No. 6,670,645 and Published PCT Applications WO 03/063555 and WO 2004/016710, and organometallic complexes described in, for example, Published PCT Applications WO 03/008424, WO 03/091688, and WO 03/040257, and mixtures thereof. In some cases the small molecule fluorescent or organometallic materials are deposited as a dopant with a host material to improve processing and/or electronic properties. Examples of conjugated polymers include, but are not limited to poly(phenylenevinylenes), polyfluorenes, poly(spirobifluorenes), polythiophenes, poly(p-phenylenes), copolymers thereof, and mixtures thereof.

In some embodiments, photoactive layer 140 includes an electroluminescent material in a host material having Formula I. In some embodiments, a second host material is also present. In some embodiments, photoactive layer 140 includes only an electroluminescent material and a host material having Formula I. In some embodiment, photoactive layer 140 includes only an electroluminescent material, a first host material having Formula I, and a second host material. Examples of second host materials include, but are not limited to, chrysenes, phenanthrenes, triphenylenes, phenanthrolines, naphthalenes, anthracenes, quinolines, isoquinolines, quinoxalines, phenylpyridines, benzodifurans, and metal quinolinate complexes.

In some embodiments, photoactive layer 140 includes an electroluminescent material in a host material having Formula II. In some embodiments, a second host material is also present. In some embodiments, photoactive layer 140 includes only an electroluminescent material and a host material having Formula II. In some embodiment, photoactive layer 140 includes only an electroluminescent material, a first host material having Formula II, and a second host material. Examples of second host materials include, but are not limited to, chrysenes, phenanthrenes, triphenylenes, phenanthrolines, naphthalenes, anthracenes, quinolines, isoquinolines, quinoxalines, phenylpyridines, benzodifurans, and metal quinolinate complexes.

Optional layer 150 can function both to facilitate electron transport, and also serve as a hole injection layer or confinement layer to prevent quenching of the exciton at layer interfaces. Preferably, this layer promotes electron mobility and reduces exciton quenching. Examples of electron transport materials which can be used in the optional electron transport layer 150, include metal chelated oxinoid compounds, including metal quinolate derivatives such as tris (8-hydroxyquinolato)aluminum (AlQ), bis(2-methyl-8-quinolinolato)(p-phenylphenolato) aluminum (BAlq), tetrakis-(8-hydroxyquinolato)hafnium (HfQ) and tetrakis-(8-hydroxyquinolato)zirconium (ZrQ); and azole compounds such as 2-(4-biphenylyl)-5-(4-t-butylphenyl)-1,3,4-oxadiazole (PBD), 3-(4-biphenylyl)-4-phenyl-5-(4-t-butylphenyl)-1,2,4-triazole (TAZ), and 1,3,5-tri(phenyl-2-benzimidazole) benzene (TPBI); quinoxaline derivatives such as 2,3-bis(4-fluorophenyl)quinoxaline; phenanthrolines such as 4,7-diphenyl-1,10-phenanthroline (DPA) and 2,9-dimethyl-4,7-diphenyl-1,10-phenanthroline (DDPA); triazines; fullerenes; and mixtures thereof. In some embodiments, the electron transport material is selected from the group consisting of metal quinolates and phenanthroline derivatives. In some embodiments, the electron transport layer further includes an n-dopant. N-dopant materials are well known. The n-dopants include, but are not limited to, Group 1 and 2 metals; Group 1 and 2 metal salts, such as LiF, CsF, and $Cs_2CO_3$; Group 1 and 2 metal organic compounds, such as Li quinolate; and molecular n-dopants, such as leuco dyes, metal complexes, such as $W_2(hpp)_4$ where hpp=1,3,4,6,7,8-hexahydro-2H-pyrimido-[1,2-a]-pyrimidine and cobaltocene, tetrathianaphthacene, bis(ethylenedithio)tetrathiafulvalene, heterocyclic radicals or diradicals, and the dimers, oligomers, polymers, dispiro compounds and polycycles of heterocyclic radical or diradicals.

An optional electron injection layer may be deposited over the electron transport layer. Examples of electron injection materials include, but are not limited to, Li-containing organometallic compounds, LiF, $Li_2O$, Li quinolate, Cs-containing organometallic compounds, CsF, $Cs_2O$, and $Cs_2CO_3$. This layer may react with the underlying electron transport layer, the overlying cathode, or both. When an electron injection layer is present, the amount of material deposited is generally in the range of 1-100 Å, in some embodiments 1-10 Å.

The cathode 160, is an electrode that is particularly efficient for injecting electrons or negative charge carriers. The cathode can be any metal or nonmetal having a lower work function than the anode. Materials for the cathode can be selected from alkali metals of Group 1 (e.g., Li, Cs), the Group 2 (alkaline earth) metals, the Group 12 metals, including the rare earth elements and lanthanides, and the actinides. Materials such as aluminum, indium, calcium, barium, samarium and magnesium, as well as combinations, can be used.

It is known to have other layers in organic electronic devices. For example, there can be a layer (not shown) between the anode 110 and hole injection layer 120 to control the amount of positive charge injected and/or to provide band-gap matching of the layers, or to function as a protective layer. Layers that are known in the art can be used, such as copper phthalocyanine, silicon oxy-nitride, fluorocarbons, silanes, or an ultra-thin layer of a metal, such as Pt. Alternatively, some or all of anode layer 110, active layers 120, 130, 140, and 150, or cathode layer 160, can be surface-treated to increase charge carrier transport efficiency. The choice of materials for each of the component layers is preferably determined by balancing the positive and negative charges in the emitter layer to provide a device with high electroluminescence efficiency.

It is understood that each functional layer can be made up of more than one layer.

The device layers can be formed by any deposition technique, or combinations of techniques, including vapor deposition, liquid deposition, and thermal transfer. Substrates such as glass, plastics, and metals can be used. Conventional vapor deposition techniques can be used, such as thermal evaporation, chemical vapor deposition, and the like. The organic layers can be applied from solutions or dispersions in suitable solvents, using conventional coating or printing techniques, including but not limited to spin-coating, dip-coating, roll-to-roll techniques, ink-jet printing, continuous nozzle printing, screen-printing, gravure printing and the like.

For liquid deposition methods, a suitable solvent for a particular compound or related class of compounds can be readily determined by one skilled in the art. For some applications, it is desirable that the compounds be dissolved in non-aqueous solvents. Such non-aqueous solvents can be relatively polar, such as $C_1$ to $C_{20}$ alcohols, ethers, and acid esters, or can be relatively non-polar such as $C_1$ to $C_{12}$ alkanes or aromatics such as toluene, xylenes, trifluorotoluene and the like. Other suitable liquids for use in making the liquid composition, either as a solution or dispersion as described herein, including the new compounds, includes, but not limited to, chlorinated hydrocarbons (such as methylene chloride, chloroform, chlorobenzene), aromatic hydrocarbons (such as substituted and non-substituted toluenes and xylenes), including triflurotoluene), polar solvents (such as tetrahydrofuran (THP), N-methyl pyrrolidone) esters (such as ethylacetate) alcohols (isopropanol), ketones (cyclopentatone) and mixtures thereof. Suitable solvents for electroluminescent materials have been described in, for example, published PCT application WO 2007/145979.

In some embodiments, the device is fabricated by liquid deposition of the hole injection layer, the hole transport layer, and the photoactive layer, and by vapor deposition of the anode, the electron transport layer, an electron injection layer and the cathode.

It is understood that the efficiency of devices made with the new compositions described herein, can be further improved by optimizing the other layers in the device. For example, more efficient cathodes such as Ca, Ba or LiF can be used. Shaped substrates and novel hole transport materials that result in a reduction in operating voltage or increase quantum efficiency are also applicable. Additional layers can also be added to tailor the energy levels of the various layers and facilitate electroluminescence.

In some embodiments, the device has the following structure, in order: anode, hole injection layer, hole transport layer, photoactive layer, electron transport layer, electron injection layer, cathode.

Although methods and materials similar or equivalent to those described herein can be used in the practice or testing of the present invention, suitable methods and materials are described below. In addition, the materials, methods, and examples are illustrative only and not intended to be limiting. All publications, patent applications, patents, and other references mentioned herein are incorporated by reference in their entirety.

EXAMPLES

The concepts described herein will be further described in the following examples, which do not limit the scope of the invention described in the claims.

Synthesis Example 1

Note that not all of the activities described above in the general description or the examples are required, that a portion of a specific activity may not be required, and that one or more further activities may be performed in addition to those described. Still further, the order in which activities are listed are not necessarily the order in which they are performed.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

It is to be appreciated that certain features are, for clarity, described herein in the context of separate embodiments, may also be provided in combination in a single embodiment. Conversely, various features that are, for brevity, described in the context of a single embodiment, may also be provided separately or in any subcombination. The use of numerical values in the various ranges specified herein is stated as approximations as though the minimum and maximum values within the stated ranges were both being preceded by the word "about." In this manner, slight variations above and below the stated ranges can be used to achieve substantially the same results as values within the ranges. Also, the disclosure of these ranges is intended as a continuous range including every value between the minimum and maximum average values including fractional values that can result when some of components of one value are mixed with those of different value. Moreover, when broader and narrower ranges are disclosed, it is within the contemplation of this invention to match a minimum value from one range with a maximum value from another range and vice versa.

What is claimed is:

1. A copolymer having Formula IV $$[[A]_x[M1]_y[M2]_z[E]_w]  \quad (IV)$$

wherein:

A is a monomeric unit having Formula A-2a (A-2a)

[Chemical structure showing: *-(phenyl with (R⁵)_f)_h-N(Ar²)-phenyl(R⁶)_{a1}-[core with (R⁷)_{a1}]_g-phenyl(R⁸)_{a1}-N(Ar²)-(phenyl with (R⁹)_f)_{h1}-*]

wherein:
- Ar² is the same or different at each occurrence and is an aryl or deuterated aryl group;
- R⁵ through R⁹ are independently the same or different at each occurrence and are selected from the group consisting of D, F, CN, alkyl, fluoroalkyl, aryl, heteroaryl, amino, silyl, germyl, alkoxy, aryloxy, fluoroalkoxy, siloxane, siloxy, deuterated alkyl, deuterated partially-fluorinated alkyl, deuterated aryl, deuterated heteroaryl, deuterated amino, deuterated silyl, deuterated germyl, deuterated alkoxy, deuterated aryloxy, deuterated fluoroalkoxy, deuterated siloxane, deuterated siloxy, and crosslinking groups, wherein adjacent R⁵ or R⁹ groups can be joined together to form a fused 5- or 6-membered aromatic ring;
- a1 is the same or different at each occurrence and is an integer from 0 to 4;
- f is the same or different at each occurrence and is 0 to the maximum number of bonding positions available;
- g is an integer from 0 to 3;
- h and h1 are the same or different and are 1 or 2;
- M1 is a monomeric unit having at least three points of attachment in the copolymer;
- M2 is an aromatic monomeric unit having two points of attachment or a deuterated analog thereof;
- E is a monomeric unit having Formula III-a (III-a)

[Chemical structure showing benzocyclobutene with R¹, R², R⁴ₐ, L¹—*, and (R³)_a substituents]

wherein:
- L¹ is selected from the group consisting of alkyl, aryl, substituted derivatives thereof, deuterated analogs thereof, and combinations thereof;
- R¹ and R² are the same or different and are H or D;
- R³ is the same or different at each occurrence and is selected from the group consisting of D, CN, halogen, alkyl, alkoxy, silyl, germyl, deuterated alkyl, deuterated alkoxy, deuterated silyl, and deuterated germyl;
- R⁴ₐ is H or D;
- a is an integer from 0-4;
- x, y, z and w are the same or different and are mole fractions, where at least x and w are non-zero; and
- * indicates a point of attachment.

2. An organic electronic device comprising an anode, a cathode, and at least one organic active layer therebetween, wherein the organic active layer comprises the compound of claim 1.

3. The copolymer of claim 1, wherein M1 is represented by Formula VII (VII)

[Chemical structure showing Ar⁹ with three phenyl groups each bearing (R⁶)_{p1} substituents and * points of attachment]

wherein:
- Ar⁹ is an aromatic moiety or a deuterated aromatic moiety having at least three bonding positions;
- R⁶ is independently the same or different at each occurrence and is selected from the group consisting of D, F, CN, alkyl, fluoroalkyl, aryl, heteroaryl, amino, silyl, germyl, alkoxy, aryloxy, fluoroalkoxy, siloxane, siloxy, deuterated alkyl, deuterated partially-fluorinated alkyl, deuterated aryl, deuterated heteroaryl, deuterated amino, deuterated silyl, deuterated germyl, deuterated alkoxy, deuterated aryloxy, deuterated fluoroalkoxy, deuterated siloxane, deuterated siloxy, and crosslinking groups, wherein adjacent R⁶ groups can be joined together to form a fused 5- or 6-membered aromatic ring;
- p1 is the same or different at each occurrence and is an integer from 0 to 4; and
- * indicates a point of attachment; and wherein z=0.

* * * * *